United States Patent
Chang et al.

(10) Patent No.: US 7,307,781 B1
(45) Date of Patent: Dec. 11, 2007

(54) TECHNIQUES FOR USING CHIRPED FIELDS TO RECONFIGURE A MEDIUM THAT STORES SPECTRAL FEATURES

(75) Inventors: Tiejun Chang, Bozeman, MT (US); Mingzhen Tian, Bozeman, MT (US); William R. Babbitt, Bozeman, MT (US); Kristian D. Merkel, Bozeman, MT (US)

(73) Assignee: Montana State University, Bozeman, MT (US)

( * ) Notice: Subject to any disclaimer, the term of this patent is extended or adjusted under 35 U.S.C. 154(b) by 0 days.

(21) Appl. No.: 11/487,571

(22) Filed: Jul. 14, 2006

Related U.S. Application Data

(60) Provisional application No. 60/699,477, filed on Jul. 15, 2005.

(51) Int. Cl.
  *G02F 1/35* (2006.01)
  *G02F 1/03* (2006.01)
  *G02B 26/00* (2006.01)
  *G11C 13/00* (2006.01)

(52) U.S. Cl. .............. 359/326; 365/106; 365/118; 359/237; 359/245; 359/252; 359/262

(58) Field of Classification Search .......... 359/326; 365/118
  See application file for complete search history.

(56) References Cited

U.S. PATENT DOCUMENTS 6,064,207 A 5/2000 Kupce
7,145,713 B2 * 12/2006 Chang et al. ............ 359/325
2006/0012797 A1 1/2006 Chang et al.
2006/0049981 A1 3/2006 Merkel et al.

OTHER PUBLICATIONS

Akhmediev, "Information erasing in the phenomenon of long lived photon echo,"Optical Letters, 1990, pp. 1035-1037,v15, Optical Society of America, Washington, DC, USA.
Dyke et al., "Experimental demonstration of data erasure for time-domain optical memories," J.Opt.Soc.Am.B,1999,pp. 805-811,v16(5),Optical Society of America, Washington, DC, US.
Elman et al., "Influence of lase phase and frequency fluctuations on photon-echo data erasure,"J.Opt.Soc.Am.B,1996,pp. 1905-1915,v. 13(9),Optical Society of America, Washington, DC.

(Continued)

*Primary Examiner*—Hemang Sanghavi
*Assistant Examiner*—Kajli Prince
(74) *Attorney, Agent, or Firm*—Evans & Molinelli PLLC; Eugene Molinelli

(57) ABSTRACT

Techniques for reconfiguring spectral features stored in a medium based on a two-state atomic system with transition dipole moment $\mu$ includes causing a chirp to pass into the medium. The chirp includes a monochromatic frequency that varies in time by a chirp rate $\kappa$ over a frequency band $B_R$ during a time interval $T_R$. The amplitude $A_R$ of the chirp is constant over $B_R$ and equal to $$A_R = (\hbar bar/\mu\pi)\sqrt{(\kappa \ln[2/\epsilon])},$$

The term hbar is reduced Plank's constant, ln is a natural logarithm function, and $\pi$ is a ratio of a circumference of a circle to a diameter of the circle. For $\epsilon \ll 1$, the atomic-state populations in the two states are inverted. For $\epsilon=1$, prior atomic-state populations are erased, with final populations equal in the two states, regardless of populations before erasure.

52 Claims, 16 Drawing Sheets

OTHER PUBLICATIONS

Kupce et al., "Adiabatic Pulses for Wideband Inversion and Broadband Decoupling," J.Magnetic Resonance A, 1995,pp. 273-276, v115,Academic Press, New York, NY, USA.

Kupce et al., "Stretched Adiabatic Pulses for Broadband Spin Inversion," J.Magnetic Resonance A, 1996,pp. 246-256, v117,Academic Press, New York, NY, USA.

Kupce et al., "Optimized Adiabatic Pulses for Wideband Spin Inversion," J.Magnetic Resonance A, 1996,pp. 299-303, v118,Academic Press, New York, NY, USA.

De Seze et al., "Coherent driving of Tm3+:YAG ions using a complex hyperbolic secant optical field," European Physical Journal D, 2005,pp. 343-355,v33, Springer,Heidelberg, DE.

Mohan et al. "Bit selective erasure of photon-echo data using Ti:S and dye laser systems: a comparative analysis,"Optics Comms, 1998, v158, pp. 149-158, Elsevier, Amsterdam,NL.

Roos et al., "Quantum computing with inhomogeneously broadened ensemble of ions," Physical Review A, 2004, pp. 1-6, v69(022321), American Physical Society, College Park, MD, USA.

\* cited by examiner

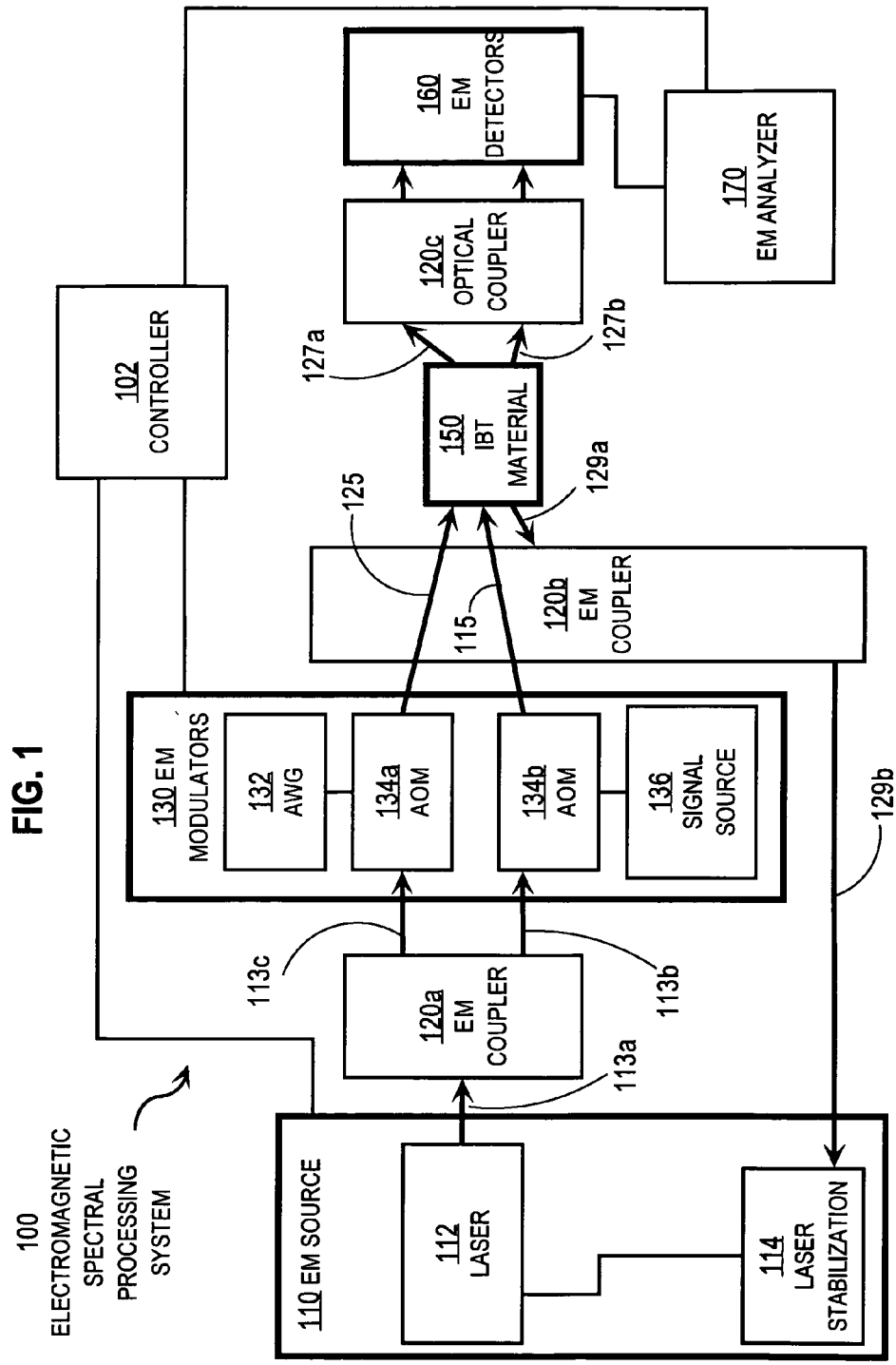

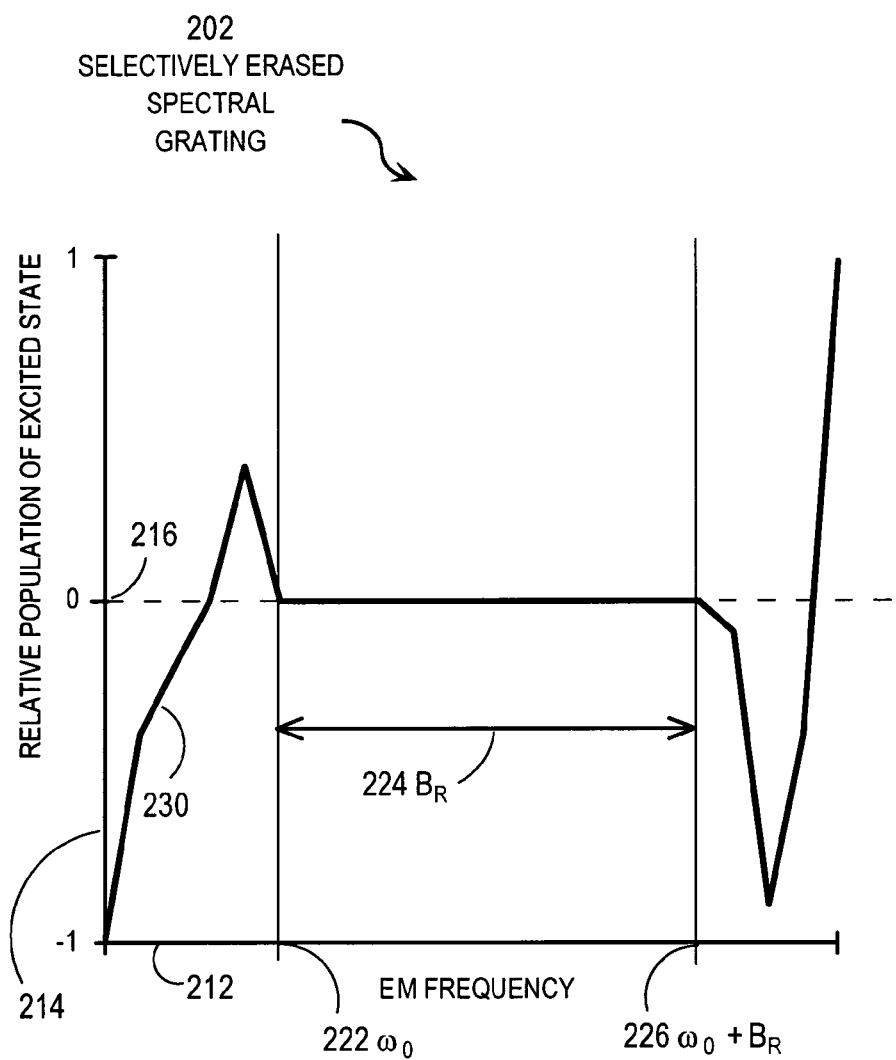

TECHNIQUES FOR USING CHIRPED FIELDS TO RECONFIGURE A MEDIUM THAT STORES SPECTRAL FEATURES

CROSS-REFERENCE TO RELATED APPLICATIONS

This application claims benefit of Provisional Appln. 60/699,477, filed Jul. 15, 2005, the entire contents of which are hereby incorporated by reference as if fully set forth herein, under 35 U.S.C. §119(e).

STATEMENT OF GOVERNMENTAL INTEREST

This invention was made with Government support under Contract Nos. MDA-972-03-1-0002 awarded by the Defense Advanced Research Projects Agency and NRO-DII-000-03-C-0312 awarded by the National Reconnaissance Office. The Government has certain rights in the invention.

BACKGROUND OF THE INVENTION

1. Field of the Invention

The present invention relates to configuring a medium with a two-state atomic system that stores spectra at electromagnetic frequencies, and, in particular, to the use of a chirped field to erase or invert spectra already stored in the medium.

2. Description of the Related Art

Information processing based on optical analog signal processing promises to provide advantages in speed, size and power over current information processing systems. Many versatile optical coherent transient (OCT) processing devices have been proposed. An OCT device relies on broadband complex spatial-spectral grating formed in the optical properties of a material, such as an inhomogeneously broadened transition (IBT) material, also called a spatial-spectral (S2) material. A spatial-spectral grating has the ability to generate a broadband optical output signal that depends on an optical probe waveform impinging on that grating and the one or more interacting optical signals that formed the grating. The optical properties of the spatial-spectral grating at any electromagnetic frequency are determined by the population of atoms in each electron quantum level state of a two-state atomic system.

In optical analog signal processing, the medium is used to store particular spectral features of interest, such as the result of the interaction of one or more optical beams carrying information. See for example, published International Patent application WO 2003/098384 entitled "Techniques for processing high time-bandwidth signals using a material with inhomogeneously broadened absorption spectrum, Inventors: K. D. Merkel, Z. Cole, K. M. Rupavatharam, W. R. Babbitt, T. Chang and K. H. Wagner, 27 Nov. 2003 (hereinafter Merkel), the entire contents of which are hereby incorporated by reference as if fully set forth herein.

In some circumstances, including those described by Merkel, the medium is an optically absorptive medium when most of the population is in the ground state of the two electron quantum level states. This reduces the signal level of a readout beam transmitted through the medium. However, when the population is evenly divided between the two states, and all coherent superposition states have decayed away, the medium is transparent, e.g., signal levels transmitted are essentially equal to the signal levels impinging. Furthermore, when most of the population is in the excited state, the medium is amplifying, e.g., signal levels transmitted are greater than the signal levels impinging.

Once the medium has been endowed with spectral content in the form of frequency dependent or spatially dependent populations, or both, the same portion of the medium can not be reused immediately without contamination by the previously stored spectral content. It is therefore necessary to return the populations of the two states to a uniform level over a range of frequencies, independent of the previously stored spectral content, before processing independent signals in the medium. The process of making population uniform over a frequency range is called erasure.

One approach used to erase spectral content in a frequency range is to wait for the atoms in the excited state to decay to the ground state, so that essentially the entire population of atoms of interest is in the ground state. A disadvantage of this approach is that decay is typically exponential and requires waiting very long times, compared to desirable processing rates, to effectively return the population to the ground state.

Another approach is to add energy to the system so that the entire population is in the excited state, making a uniform spectrum, and wait for the system to decay to a level desired for processing, such as all in the ground state or equal populations in both states. A disadvantage of this approach is that it takes substantial energy. Another disadvantage is that it takes a long time to decay to a desired population distribution, even to equal populations in both states.

Another approach is to write on top of the previously written spectrum with approximately the opposite spectral content, such that the process cancels the previous spectral grating. A disadvantage of this approach is that the spectral content already stored in the medium must be known well. Another disadvantage is that perfect cancellation is not possible due to non-linearities and population decay. Furthermore, the population decay time must be very long compared to the time to perform the erasure, so that the over-write does not impose a lower strength inversion of the original spectrum.

It is sometimes advantageous to invert the population levels, without removing the spectral content. For example, when the spectral content in an absorbing medium is such that most of the atoms are in the ground state, it is advantageous to invert the population levels so that the readout beam signal level is higher. The process of inverting the population of the two states is called inversion. However, no publication known to applicants has addressed inversion of frequency-dependent populations; publications have only addressed uniform populations.

In one approach to inverting a uniform population over a frequency band, a chirped optical field has been used. The frequency and amplitude of the chirped field are as given for a hyperbolic secant in Table 1, described next.

Other two-state atomic systems have been used. For example, in nuclear magnetic resonance (NMR) applications, the populations of atoms in two quantum spin states are measured. These spin states affect the signals emitted at electromagnetic frequencies outside the optical frequency range.

Inversion of a uniform spin population in a two spin system has been proposed, using a variety of functional forms for time dependence of amplitude and frequency, in a series of papers including U.S. Pat. No. 6,064,207, by E. Kupce, entitled "Adiabatic pulses for wideband inversion and broadband decoupling", May 16, 2000 (hereinafter Kupce), the entire contents of which are hereby incorporated by reference as if fully set forth herein. Table 1 summarizes the functional forms described in these series of publications.

TABLE 1

Amplitude and frequency of electromagnetic field for used for uniform population inversion in NMR.

| Name | Amplitude, A(t) = | Frequency, ω(t) = |
|---|---|---|
| Hyperbolic Secant | Amax sech(βt) | λ tanh(βt) |
| Gaussian | Amax $e^{-\beta t}$ | λ erf(βt) |
| Lorenzian | Amax/(1 + (βt)$^2$) | λ (arctan(βt) + βt/(1 + (βt)$^2$))/2 |
| Cosine | Amax cos(βt) | λ (βt + sin(βt) cos(βt))/2 |
| Cosine Square | Amax cos$^2$(βt) | λ (12βt + 8sin(βt) + sin(4βt))/32 |
| WURST-n | Amax(1 − \|sin(βt)\|$^n$) | $\kappa_c$ t |

In Table 1, the angle βt runs from −π/2 to +π/2; Amax is the maximum amplitude of the electromagnetic field (the magnetic field in Kupce); $\kappa_c$ is a constant chirp rate equal to a constant frequency change per unit time; and n is a large integer. The constant λ is given by Expression 1

$$\lambda = A\max^2/\beta Q \quad (1)$$

where Q is an adiabatic factor greater than one. Thus the frequency range scale λ, the temporal duration scale ε, the amplitude scale Amax are related. Kupce also proposes a stretched pulse in which a central part is a constant-amplitude (Amax) linear sweep with constant chirp rate $\kappa_c$, and the rising and falling edges are adiabatic pulses of the form given in Table 1 for βt<0, and βt>0, respectively.

Based on the foregoing, there is a clear need for techniques to configure a medium to eliminate the influence of prior stored spectral features, such as gratings, that do not suffer all the deficiencies of prior approaches.

Based on the foregoing, there is also a need for techniques to configure a medium to invert prior stored, non-uniform spectral features, such as gratings, that do not suffer all the deficiencies of prior approaches.

SUMMARY OF THE INVENTION

1. Techniques are provided for reconfiguring spectral features in a medium using a chirped electromagnetic field. These techniques allow for erasure or inversion or both and enable faster OCT and NMR processing as well as adjustable integrated absorption of a material in selectable frequency bands and selectable spatial portions of the medium.

In a first set of embodiments, a method for erasing spectral features stored in a medium includes causing a chirped electromagnetic field to pass into the medium. The spectral features are based on a two-state atomic system having a transition dipole moment of μ, in which an atom transitions between a first state and a second state. The chirped electromagnetic field has a monochromatic frequency that varies in time by a chirp rate κ over an erasure frequency band of bandwidth $B_E$ during an erasure time interval $T_E$. A maximum amplitude $A_E$ of the electromagnetic field oscillations in the chirped electromagnetic field over the erasure frequency band is substantively constant and substantively specified by an equation of form $$A_E = (h\text{bar}/\mu\pi)\sqrt{(\kappa \ln 2)},$$

in which hbar is reduced Plank's constant and ln is a natural logarithm function. As a result, substantively fifty percent of the two-state atomic system responsive in the erasure frequency band exposed to the chirped electromagnetic field is in the first state after erasure regardless of a percentage in the first state before erasure.

In some embodiments of the first set, the chirped electromagnetic field further includes a start edge in a start time interval $T_S$ adjacent before the erasure time interval $T_E$. An amplitude $A_S$ of the electromagnetic field oscillations during the start time interval $T_S$ increases with a substantively continuous first derivative from substantively zero at a start of the start time interval $T_S$ to $A_E$ and a substantively zero rate of change at an end of the start time interval $T_S$.

In some embodiments of the first set, a frequency ω(t) of the electromagnetic field oscillations at a time t during the start time interval $T_S$ changes with a substantively continuous first derivative to match a start frequency $\omega_0$ and start frequency rate of change κs at a start of the erasure time interval $T_E$.

In some embodiments of the first set, a phase of the electromagnetic field oscillations during the start time interval $T_S$ changes with a substantively continuous first derivative to match a start phase and start phase rate of change at a start of the erasure time interval $T_E$.

In some embodiments of the first set, the chirped electromagnetic field further includes a finish edge in a finish time interval $T_F$ adjacent after the erasure time interval $T_E$. An amplitude $A_F$ of the electromagnetic field oscillations during the finish time interval $T_F$ decreases with a substantively continuous first derivative from a value substantively equal to $A_E$ with a substantively zero rate of change at a start of the finish time interval $T_F$ to zero at an end of the finish time interval $T_F$.

In some embodiments of the first set, a frequency ω(t) of the electromagnetic field oscillations at a time t during the finish time interval $T_F$ changes with a substantively continuous first derivative to match an end-erase frequency ωe and an end-erase frequency rate of change κe at an end of the erasure time interval $T_E$.

In some embodiments of the first set, a phase of the electromagnetic field oscillations during the finish time interval $T_F$ changes with a substantively continuous first derivative to match an end-erase phase and an end-erase phase rate of change at an end of the erasure time interval $T_E$.

In some embodiments of the first set, the chirp rate κ is substantively constant over the erasure frequency band and substantively equal to $B_E/T_E$.

In some embodiments of the first set, interactions of the chirped electromagnetic field and the medium are coherent over a time scale up to time $T_2$. The chirp rate κ within the erasure frequency band satisfies an inequality given by $$\kappa \gg \ln 2/(\pi T_2)^2,$$

whereby erasure is effective even at small values for $T_2$.

In a second set of embodiments, a method for inverting non-uniform spectral features stored in a medium includes causing a chirped electromagnetic field to pass into the medium. The non-uniform spectral features are based on a two-state atomic system having a transition dipole moment of μ, in which an atom transitions between a first state and a second state. The chirped electromagnetic field has a monochromatic frequency that varies in time by a chirp rate κ over an inversion frequency band of bandwidth $B_I$ during an inversion time interval $T_I$. A maximum amplitude $A_I$ of the electromagnetic field oscillations in the chirped electromagnetic field over the inversion frequency band is substantively constant and substantively specified by an equation of form $$A_f = (\hbar bar/\mu\pi)\sqrt{(\kappa \ln[2/\epsilon])},$$

in which hbar is Plank's constant, ln is a natural logarithm, and $\epsilon$ is a non-zero fractional difference from complete inversion. As a result, a particular relative population (r) of the excited state of the two-state atomic system, responsive at a particular frequency in the inversion frequency band exposed to the chirped electromagnetic field, is substantively equal to $X^*(1-\epsilon)$ after inversion when the relative population of the excited state is $-X$ before inversion, wherein r is +1 for all atoms in the excited state and -1 for all atoms in the ground state.

In other sets of embodiments, an apparatus is configured to perform one or more steps of the above methods.

In various embodiments, these population reconfiguration techniques enable a medium to be erased and reused in a shorter time than population decay, even when the stored spectrum is unknown.

Furthermore, in various embodiments, these population reconfiguration techniques enable a net absorptive path through a stored spectrum to switch to a net gain (amplification) path through the same spectrum.

Furthermore, in various embodiments, these techniques allow a portion of an absorptive medium to be set to any desired level of absorption, such as any between absorption associated with fully populated ground state and gain associated with fully populated excited state.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 is a block diagram that illustrates components of an optical system for storing spectral features and reconfiguring an optical medium, according to an embodiment;

FIG. 2B is a graph that illustrates erasure of a selected portion of the spectral content in the medium, according to an embodiment;

DETAILED DESCRIPTION

Figure 2A:
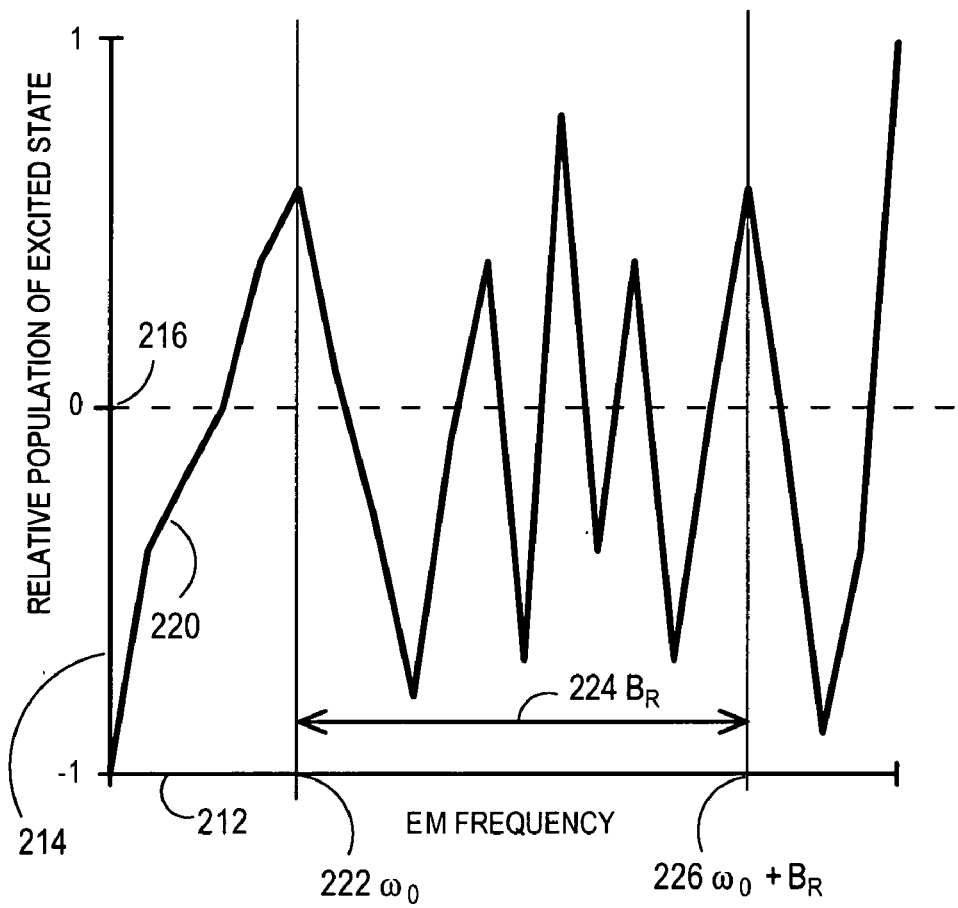
FIG. 2A is a graph that illustrates spectral content in relative population of excited state in a two state atomic medium.

Techniques are described for reconfiguring atomic state populations using a chirped laser field. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Several embodiments of the invention are descried below in the context of spectral-spatial gratings formed by optical absorption variations in an IBT material. However, the invention is not limited to this context. In other embodiments of the invention, the techniques are applied to other two-state atomic systems in which population in each state determines other optical or non-optical electromagnetic properties, including such properties as absorption, refraction, reflection, polarization, fluorescence. In some embodiments, the atomic systems include one or more additional states that are relatively rarely populated compared to the two primary transition states or that can be substantially populated, such as one or more bottleneck states in the decay from the excited state, to inhibit transitions to those additional states.

Swept frequency modulated electromagnetic signals are called herein "chirped electromagnetic fields," and "chirped laser fields" when the frequencies are confined to the optical range. The frequency sweep can be linear in time with a constant chirp rate (called linear chirp or linear frequency modulation, LFM) or non-linear with a time varying chirp rate. Optical LFM signals have been used as waveforms in pulse sequences to write spatial-spectral gratings for applications of storage, signal processing, true time delay generation, and arbitrary waveform generation, and also as probe waveforms for readout of spectral gratings. Such LFM probe waveforms generate a temporal output signal that represents a collective readout of all the absorbers, as with brief pulse excitation, but under the condition of swept excitation. By properly choosing the rate of frequency change with time, called herein the chirp rate $\kappa$, a temporal readout is produced that is slow enough to be digitized by low cost, high performance digitizers in the frequency bands of interest, as described by Merkel. The frequency sweep rate or chirp rate over the band, κ, is defined as the frequency scan range, or bandwidth of the chirp, Bc, divided by the duration of the sweep time, Tc, as given by Expression 2a $$\kappa = Bc/Tc, \qquad (2a)$$

1. STRUCTURAL OVERVIEW

FIG. 1 is a block diagram that illustrates components of an optical system for storing spectral content and reconfiguring atomic state populations in an optical medium, according to an embodiment. Although a certain number of components are shown in FIG. 1 for the purposes of illustration, in other embodiments more or fewer components are included in system 100. Furthermore, the components described here refer to operation for optical frequencies. In other embodiments, other equivalent or corresponding components for other electromagnetic phenomena, such as nuclear magnetic resonance (NMR) replace or add to the components described with reference to FIG. 1.

Electromagnetic spectral processing system 100 includes a controller 102, one or more electromagnetic (EM) source 110, electromagnetic couplers 120a, 120b, 120c (collectively referenced hereinafter as couplers 120), electromagnetic modulators 130, two-atomic-state material (such as IBT material 150), electromagnetic detectors 160, and post-detection electronics, such as electromagnetic signal analyzer 170.

In the illustrated embodiment 100, EM source 110 includes an input laser 112 and a laser stabilization block 114. This laser 112 provides stabilized optical carrier frequency beams 113a in the TeraHertz range (THz, 1 THz=$10^{12}$ cycles per second) used to carry a target optical spectrum and a chirped laser field used as a probe waveform and a population reconfiguration waveform. In some embodiments, a single laser provides the carrier frequency beam 113a for both the target optical spectrum and probe signals. In some embodiments, additional laser sources are included in EM source 110. In some various embodiments, electric signals from laser stabilization block 114 controls frequency, amplitude or phase, or some combination, for laser 112. Propagation of EM waveforms is indicated in FIG. 1 by straight arrows. Electronic connections for signal processing and control are represented by segmented lines without arrowheads.

The EM couplers 120 direct EM waveforms, such as optical beam 113a, between the various components and include such optical couplers as mirrors, phase plates, optical fibers, among others well known in the art of optics and electromagnetic propagation. In the illustrated embodiment, EM coupler 120a splits carrier beam 113a into two carrier beams 113b, 113c at the same optical frequency.

The EM modulators 130 modulate the carrier frequency beams to produce signal beams with rich frequency content. In the illustrated embodiment, EM modulators 130 include input signal source 136, acousto-optic modulators (AOMs) 134a, 134b (collectively referenced hereinafter as AOMs 134) and arbitrary waveform generator (AWG) 132. In some embodiments, one or more AOMs 134 are replaced with or added to other optical modulators such as one or more electro-optic phase modulators (EOPMs), electro-optic amplitude modulators, and electro-absorption modulators. In some embodiments, AWG 132 is replaced by or added to other wave generators, such as one or more pulse pattern generators.

The input signal source 136 is any combination of components that generate a target optical spectrum to be placed on an optical carrier for use in system 100. For example, input signal source 136 is a radio frequency signal to be analyzed, such as a radar pulse or its reflected return, or both, as described in Merkel. The input signal source 136 is an electronic signal, such as a voltage. AOMs 134 are used to modulate the optical carrier 113b from input laser 112 in proportion to the sign and magnitude of an applied RF voltage. This produces an encoded optical field 115 with a target optical spectrum. In other embodiments, other modulators are used in place of or in addition to AOMs 134 to produce optical field 115 encoded in frequency or amplitude or both with the target optical spectrum. In other embodiments, multiple modulated laser beams 115 in one or more directions interact to form the optical target optical spectrum. The single direction of the depicted optical field 115 is called a collinear geometry, which records only the spectral content of the signal. In some embodiments, various angled beam geometries are used, in which the signal 115 consists of multiple beams impinging on the two-state material (e.g., IBT material 150) in different directions.

The AWG 132 generates a chirped radio frequency waveform (such as a linear radio-frequency chirp) of bandwidth B around a carrier radio frequency. The AOM 134a imposes this same chirp bandwidth B on the laser carrier beam 113c to produce one or more chirped laser fields 125 starting at an optical frequency ($\omega$s). In other embodiments, the laser 112 can create an optical chirp, and no external modulator scheme, such as the combination of components 134a and 132, is needed or used The EM two-atomic-state material (e.g., IBT material 150) records one or more EM fields 115 that impinge on the material with sufficient intensity and duration. When multiple beams interact in the material at different angles, spatial-spectral structures are formed in the material. When all beams impinge in the same direction only spectral content is recorded. For example, in some embodiments the two-atomic-state material is an IBT material 150 that stores a complex spatial-spectral grating as absorption variations within a doped, low temperature crystal. In some embodiments, the one or more optical fields 115 produce target optical spectra as spectral or spatial-spectral gratings. In some embodiments, one or more chirped laser fields 125, are recorded as spectral or spatial-spectral gratings in IBT material 150. At a later time, another optical beam is directed with relatively lower intensity to the optical material IBT to produce one or more response fields 127a, 127b (collectively referenced hereinafter as response fields 127). The chirped laser field 125 and the optical field 115 may impinge on the material at the same location and angle or at different locations and angles.

In some embodiments, for laser stabilization, field 113a is also passed by coupler 120a into IBT material 150 and a feedback field 129a is emitted by the IBT material 150. The feedback field 129a is passed by EM coupler 120b as field 129b to laser stabilization block 114. Based on the properties of feedback field 129b, the laser stabilization block 114 controls laser 112.

For heterodyne readout processes, a reference optical field (e.g., field 127b) is also produced in addition to a primary response field (e.g., 127a). Any method of generating a reference field may be used. In the illustrated embodiment, the reference optical field 127b emerges from the optical material, usually in a spatial mode that has not recorded the target optical spectrum from optical field 115, such as experienced by chirped laser field 125. In some embodiments, the reference signal 127b is a chirped laser field (not shown) that has not passed through the IBT material 150. In some embodiments, the reference signal 127b is the transmitted probe signal that is naturally in the same direction as the response signal 127a that itself is often delayed. Thus, in such embodiments, the signal detected at the optical detectors 160 is naturally heterodyne. In some embodiments, the reference signal 127b is a response signal from the chirped optical field interacting with one or more spatial-spectral gratings recorded in the IBT material 150 for the purpose of generating a reference field.

The EM detectors 160 include one or more detectors such as optical detector that detect the time-varying optical intensity in a certain optical bandwidth. In some embodiments, a one- or two-dimensional array of optical detectors is used to simultaneously detect a response field 127 on multiple spatial modes. Scanned or instant images can be generated by the array of detectors. In some embodiments, the EM detector 160 detects only the response field 127a. In some embodiments, the EM detector 160 detects the heterodyne combination of the response field 127a and reference field 127b. For example, the heterodyne combination generates beat frequency variations that are much lower in frequency and larger in amplitude than response signal 127 intensity variations; therefore the beat frequency variations are more accurately measured with current detectors.

The post-detection electronics in EM analyzer 170 use electrical signals output by detectors 160. In the illustrated embodiment, EM analyzer 170 includes a scope, digitizer and processor. In various embodiments, EM analyzer 170 includes different hardware and software components.

The controller 102 uses electronic signals to control EM modulators and EM source 110. In some embodiments the controller uses electronic signals from EM analyzer 170 to determine how to control EM source 110 and EM modulators 130. In various embodiments, controller 102 includes different hardware and software components that perform the methods described in the next section.

In various embodiments, spectral content is imposed in the IBT material or read or both based on the interaction of one or more optical fields 115 or 125 or both. The spectral content is then erased or inverted or both based on one or more subsequent chirped electromagnetic fields 125 designed for reconfiguration of atomic state populations in IBT material 150.

For example, FIG. 2A is a graph 201 that illustrates spectral content in at least a portion of a medium in terms of relative population of excited state in a two state atomic medium, such as IBT material 150. The horizontal axis 212 represents frequency of electromagnetic oscillations, ω, that interact with the medium in the portion of interest. The vertical axis 214 represents the relative population of atoms in the excited state (r) in the portion of the medium of interest. In some publications, the quantity r represented by the vertical axis is called population inversion, because it increases as the percentage of atoms in the excited state. However, to avoid confusion with the use of the term "inversion" for the inverting action described herein, the term "relative population of excited state" is used herein. A value of −1 indicates that substantively 100% of the atoms are in the ground state. A value of +1 indicates that substantively 100% of the atoms are in the excited state. A value of 0 indicates that substantively 50% of the atoms are in the ground state and substantively 50% of the atoms are in the excited state. The same atom type with the same dipole moment absorbs and emits at different frequencies based on inhomogeneities of the surrounding material.

It is assumed for purposes of illustration that in the ground state an atom absorbs an incident photon of the associated EM frequency, and in the excited state an atom emits a photon of the associated EM frequency when stimulated by an incident photon of that frequency. As a result, the medium is a maximum absorbing medium when the relative population is −1, is a transparent medium when the relative population is about 0, and is a maximum amplifying (gain) medium when the relative population is +1. Between −1 and 0, the medium is an absorbing medium to various degrees. Between 0 and +1, the medium is a gain medium to various degrees.

The graph 201 includes trace 220 that depicts the relative populations of the excited state for atoms that respond to different incident photon frequencies. The population shows frequency-dependent variations called herein spectral features or spectral content. The spectral features may be imposed in any manner known in the art, including illuminating the medium with one or more signals made up of photon beams of various frequency components with sufficient intensity for sufficient duration, such as described in Merkel.

For purposes of illustration, it is assumed that, in a frequency band of interest from $\omega_0$ 222 to $\omega_0+B_R$ 226 on axis 212, in this spatial portion of interest in the medium, it is desirable to reconfigure the population. The bandwidth $B_R$ 224 of the frequency band of interest to be reconfigured is depicted in FIG. 2A. The reconfiguration involves erasure or inversion or both, as described in more detail below. It is noted that the medium is mostly absorbing in the frequency band to be reconfigured.

FIG. 2B is a graph 202 that illustrates erasure of a selected portion of the spectral content in the medium, according to an embodiment. The axes 212, 214 and values $\omega_0$ 222, $\omega_0+B_R$ 226, and bandwidth $B_R$ 224 are as described in graph 201. In the reconfiguration band $\omega_0$ 222 to $\omega_0+B_R$ 226 for erasure, the relative population of the excited state is zero. No residue of the former spectral content in this erasure frequency band is evident. In the illustrated embodiment, the medium is transparent for the entire frequency band. The medium can be reused for storing new spectral features after some of the population has decayed to the ground state.

Figure 2C:
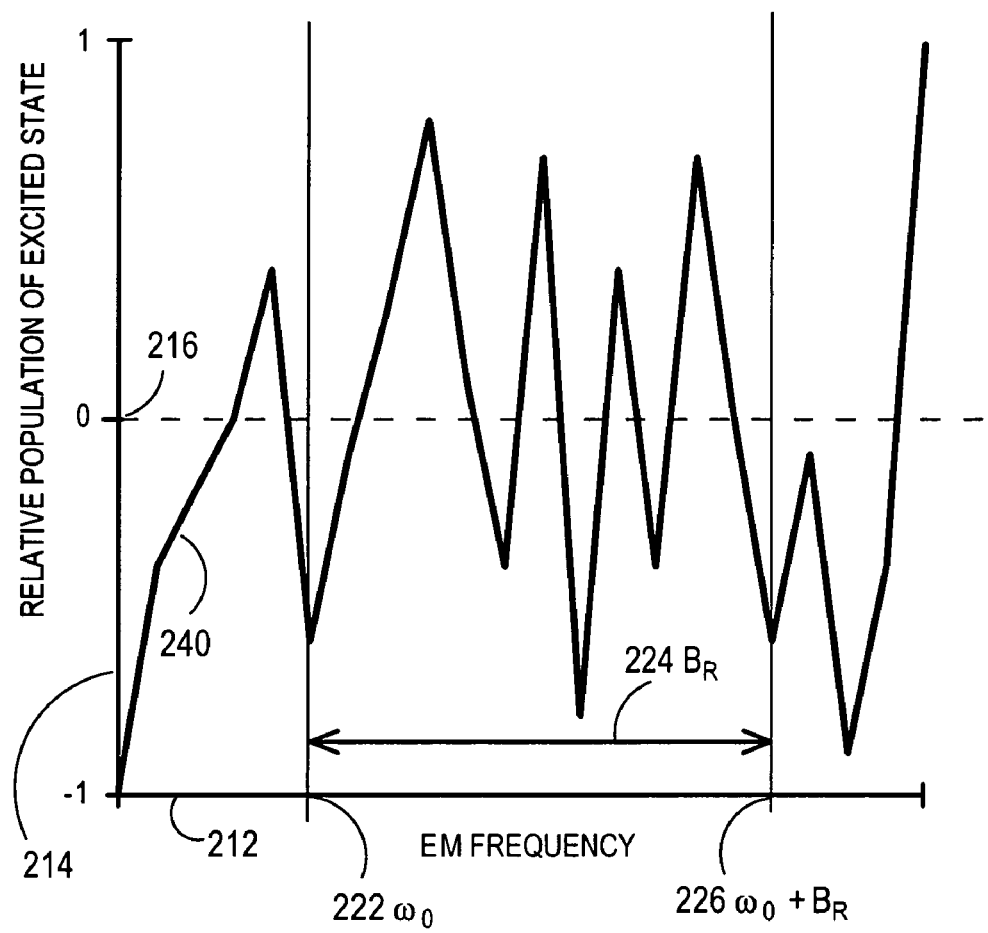
FIG. 2C is a graph that illustrates inversion of a selected portion of the spectral content in the medium, according to an embodiment.

FIG. 2C is a graph 203 that illustrates inversion of a selected portion of the spectral content in the medium, according to an embodiment. The axes 212, 214 and values $\omega_0$ 222, $\omega_0+B_R$ 226, and bandwidth $B_R$ 224 are as described in graph 201. In the reconfiguration band $\omega_0$ 222 to $\omega_0+B_R$ 226 for inversion, the relative population of the excited state at each frequency ω is complementary to the relative population formerly at that frequency. The same spectral information is evident, but the medium is mostly amplifying in the inverted frequency band. This inversion may be useful in providing a stronger signal when the medium is subsequently read with a probing beam.

It is noted that uniform absorbing/amplifying properties of the medium can be set with a combination of erasure, waiting for decay and inversion. For example, in some embodiments, absorption associated with a relative population value of −0.5 is achieved for any frequency band of interest by erasing that band and waiting for a particular time until population decay has produced a relative population value of −0.5. In general, to achieve a desired relative population value, rd, after the erasure process has been completed, the waiting time, $T_W$, is given by Expression 2b.

$$T_W = T1 * \ln(1/(rd+1)) \quad (2b)$$

where T1 is the excited state population lifetime. As a result, absorption associated with an rd value of −0.5 is achieved in these embodiments by 1) erasing that band, 2) waiting for a time $T_W$ given by Expression 2b with rd=−0.5.

As a further example, in some embodiments, a gain associated with a relative population value of +0.5 is achieved for any frequency band of interest by adding the following step after the above two steps:

3) inverting the same frequency band.

The following sections show how erasure or inversion of an arbitrary frequency band in a portion of interest in a material can be achieved.

2. THEORETICAL OVERVIEW

The following theoretical considerations are presented so that the working of embodiments of the invention may be more readily described and understood. However, the invention is not limited by the assumptions or statements or accuracy of these theoretical descriptions.

It has been observed that, when an atom (or some other two-state system) is illuminated by a coherent beam of photons, it will cyclically absorb photons and re-emit them by stimulated emission. One such cycle is called a Rabi cycle and the inverse of its duration is called the Rabi frequency of the photon beam, designated herein as $\Omega$. The Rabi frequency $\Omega$ depends on a dipole moment $\mu$ of a transition between the two states and the maximum amplitude Amax of the electromagnetic field oscillations of the coherent beam. Amax is proportional to the square root of the intensity of the beam. A Rabi frequency may be defined for electric charge states interacting with an electric field E or for magnetic states interacting with a magnetic field H of the propagating electromagnetic wave. The Rabi frequency is defined by Expression 3.

$$\Omega = \mu A\max/\hbar\text{bar} \quad (3)$$

where hbar is reduced Plank's constant and, as suggested above, $\mu$ is the transition dipole moment of a two-level atom on which the field acts.

For population reconfiguration over a frequency band of interest, it is ideal that the amplitude Amax be constant for all frequencies in the band. A constant amplitude linear chirp with a high time bandwidth product (Tc Bc) over a band much larger than the band of interest has such a constant amplitude in the band of interest. The changes in relative population r driven by such an ideal chirp with Rabi Frequency $\Omega_C$ have been investigated and can be expressed by the following Expressions 4a and 4b.

$$r(\omega, tf) = (1 - 2\Theta) r(\omega, ti) \quad (4a)$$

$$\Theta = 1 - \exp(-\pi^2 \Omega_C^2/\kappa) \quad (4b)$$

where ti is time before application of the chirp, tf is time after application of the chirp, and exp(x) is the function representing e, the base of the natural logarithm (ln e=1), raised to the power x. In the following, the symbol ri denotes $r(\omega, ti)$ and the symbol rf denotes $r(\omega, tf)$. The quantity $\Theta$ is called the driving strength of the field with chirp rate $\kappa$ and Rabi Frequency $\Omega_C$. $\Theta$ varies between 0 and 1. It is expected that Expressions 4a and 4b also apply for slowly changing chirp rate $\kappa$ over the frequency band of interest and for magnetic states responding to magnetic oscillations at non-optical frequencies.

Figure 3A:
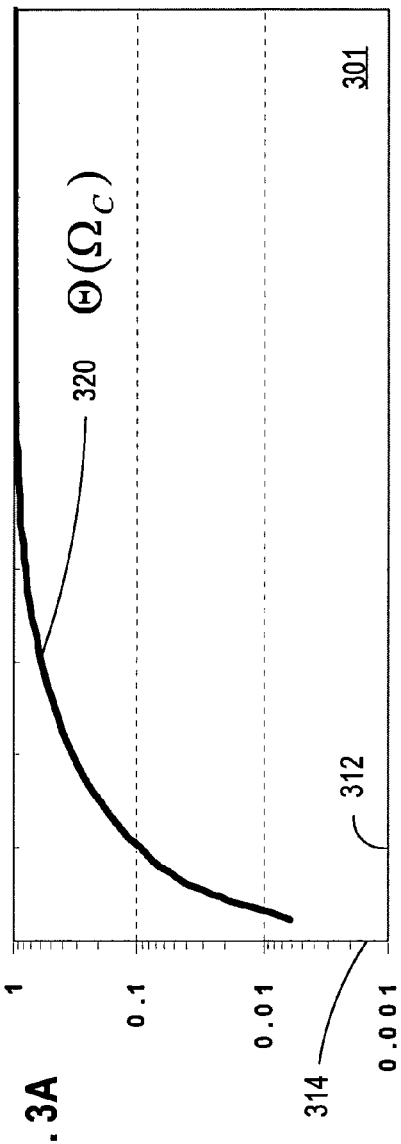
FIG. 3A and FIG. 3B are graphs that illustrate the effects of driving electromagnetic force on the populations of two states in a two-state atomic system.
Figure 3B:
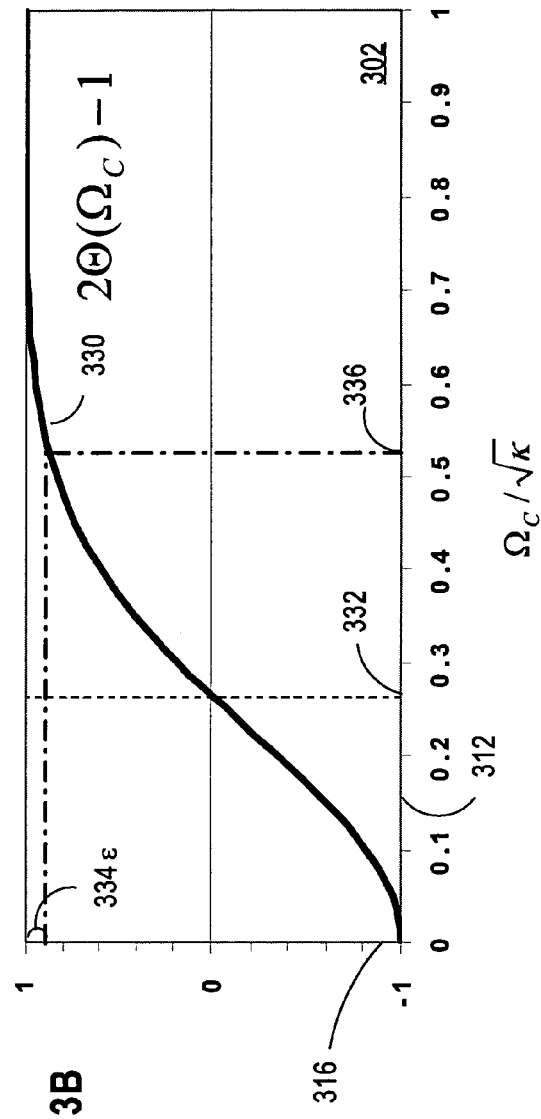

FIG. 3A and FIG. 3B are graphs 301 and graph 302, respectively, that illustrate the effects of driving electromagnetic force on the populations of two states in a two-state atomic system. FIG. 3A is a graph 301 that illustrates the value of $\Theta$ as a function of a dimensionless quantity $\Omega_C/\sqrt{\kappa}$, a square root of a factor in the argument of the function exp in Expression 4b. The horizontal axis 312 gives the value of $\Omega_C/\sqrt{\kappa}$. The vertical axis 314 gives the value of $\Theta$ on a logarithmic axis to show detail at small values $\Theta$. FIG. 3B is a graph 302 that illustrates the value of 2$\Theta$−1 (the negative of the factor for r(w,ti) in Expression 4a) as a function of the same dimensionless quantity $\Omega_C/\sqrt{\kappa}$. The horizontal axis 312 is as described above. The vertical axis 314 gives the value of 2$\Theta$−1.

3. FUNCTIONAL OVERVIEW

According to various embodiments of the invention, amplitude Amax of electromagnetic oscillations is chosen so that over a finite frequency band of a chirp, Amax leads to a value of $\Theta$ associated with either erasure or relative population inversion.

It is noted that, when $\Theta$ equals ½, rf equals zero. Because $\Theta$ does not depend on $\omega$, rf equals zero for all frequencies, thus effectively erasing all frequencies in the linear chirp, regardless of the initial populations at those frequencies. This can be seen in FIG. 3B. When 2$\Theta$−1 equals 0 (i.e., $\Theta$=½) at value 332 on axis 312, the relative population at all frequencies goes to zero and the spectral content is erased. Using the definition of the Rabi Frequency in Expression 2a and the definition of $\Theta$ in Expression 4b, Amax can be determined that is associated with erasure, as derived in Expressions 5a through 5g.

$$2\Theta - 1 = 0 \quad (5a)$$

$$1 - \exp(-\pi^2 \Omega_C^2/\kappa) = \tfrac{1}{2} \quad (5b)$$

$$\exp(-\pi^2 \Omega_C^2/\kappa) = \tfrac{1}{2} \quad (5c)$$

$$-\pi^2 \Omega_C^2/\kappa = \ln(\tfrac{1}{2}) \quad (5d)$$

$$\Omega_C^2 = (1/\pi^2)\kappa \ln 2 \quad (5e)$$

$$\Omega_C = \mu A\max/\hbar\text{bar} = (1/\pi)\sqrt{(\kappa \ln 2)} \quad (5f)$$

$$A\max = (\hbar\text{bar}/\mu\pi)\sqrt{(\kappa \ln 2)} \quad (5g)$$

It is further noted that, as $\Theta$ approaches a value of 1, the relative population inverts from ri at time ti to −ri at time tf. When 2$\Theta$−1 equals 1, the populations are inverted. As can be seen in FIG. 3A and FIG. 3B, neither $\Theta$ nor 2$\Theta$−1 ever equal 1, but both asymptotically approach 1. It is noted however, that for any difference $\epsilon$ 334, 2$\Theta$−1=1−$\epsilon$, at point 336 on axis 312. Therefore it is possible to select a desired value $\epsilon$ 334 that is arbitrarily small. The associated value of $\Omega_C/\sqrt{\kappa}$ results in a relative population that is arbitrarily close to complete inversion. Amax can be determined that is associated with near complete inversion, as derived in Expressions 6a through 6g.

$$2\Theta - 1 = 1 - \epsilon \quad (6a)$$

$$1 - \exp(-\pi^2 \Omega_C^2/\kappa) = 1 - \epsilon/2 \quad (6b)$$

$$\exp(-\pi^2 \Omega_C^2/\kappa) = \epsilon/2 \quad (6c)$$

$$-\pi^2 \Omega_C^2/\kappa = \ln[\epsilon/2] \tag{6d}$$

$$\Omega_C^2 = (1/\pi^2)\kappa \ln[2/\epsilon] \tag{6e}$$

$$\Omega_C = \mu A\text{max}/\hbar\text{bar} = (1/\pi)\sqrt{(\kappa \ln[2/\epsilon])} \tag{6f}$$

$$A\text{max} = (\hbar\text{bar}/\mu\pi)\sqrt{(\kappa \ln[2/\epsilon])} \tag{6g}$$

It is noted that Expression 5g is equivalent to Expression 6g with $\epsilon=1$. However, inversion is nearly achieved using Expression 6g only when $\epsilon<<1$.

Theoretically, Expression 4a (and consequently Expression 5g and Expression 6g) applies for a large time-bandwidth product, i.e., Tc Bc>>1, which ensures a uniform spectral amplitude for the chirped electromagnetic pulse over the frequency band. A linear chirp truncated in time $t_0$ the band of interest typically has spectral amplitude fluctuations within the frequency band of interest. The spectral amplitude fluctuations can be minimized by adding edges before and after the frequency band of interest in which the amplitude rises and falls, respectively, sufficiently slowly to achieve this effect. Several functional forms for slowly rising and falling amplitudes are listed in Table 1. Others may also be used.

According to some embodiments of the invention, functional forms for rising and falling edges (also called start edge and finish edge, respectively) are selected so that the values and first derivatives of amplitude, frequency and phase are all continuous at the boundaries with the frequency band of interest. In some embodiments, the frequency functional forms are selected to use as little of the frequency bandwidth available in the equipment as possible during the start and finish edges, so that most of the available bandwidth is left for the band of interest to be reconfigured. In various embodiments, both linear and non-linear chirps are used in the frequency band to be reconfigured.

Figure 4:
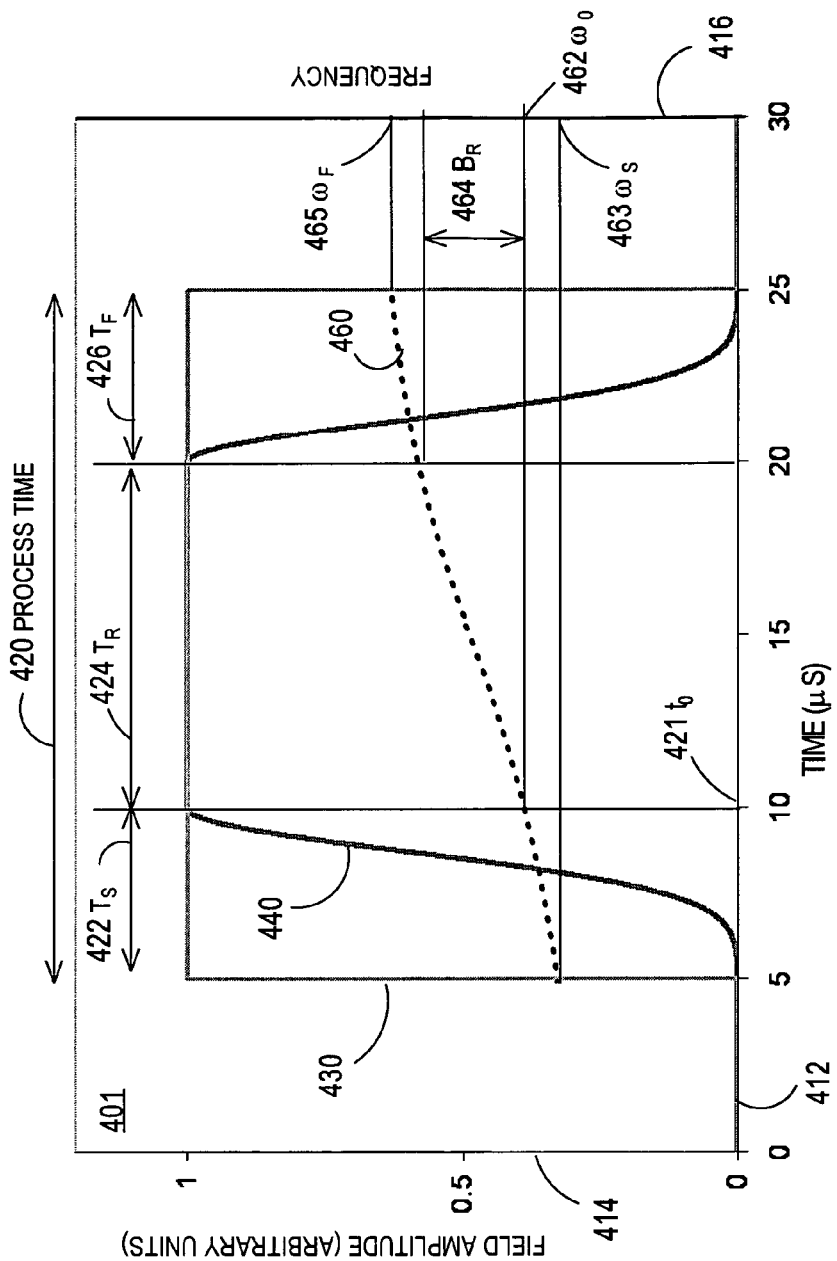
FIG. 4 is a graph that illustrates the temporal shape of amplitude and frequency of a chirped electromagnetic field to selectively reconfigure populations of two atomic states in a medium, according to an embodiment.

FIG. 4 is a graph that illustrates the temporal shape of amplitude and frequency of a chirped electromagnetic field to selectively reconfigure populations of two atomic states in a medium, according to an embodiment. The horizontal axis 412 is time in microseconds ($\mu$s, 1 $\mu$s=$10^{-6}$ seconds). The left side vertical axis 414 is field amplitude maximum of the coherent beam in arbitrary units, in which the value I corresponds to Amax. The right side vertical axis 416 is frequency of the coherent beam in arbitrary units.

Trace 430 plots the maximum amplitude for a coherent beam with a square maximum amplitude envelope. Trace 440 plots the maximum amplitude for a coherent beam with a slowly varying start edge and a slowly varying finish edge sandwiching a constant amplitude reconfiguration chirp. The constant amplitude reconfiguration chirp has duration $T_R$ 424 beginning at time $t_0$ 421. The start edge has duration $T_S$ 422 ending at to 421. The finish edge has duration TF 426 beginning at time $t_0$ 421 plus $T_R$ 424. Trace 460 plots a non-linear frequency variation of the electromagnetic oscillations for both trace 430 and trace 440. In some embodiments, a linear frequency chirp (not shown) is used instead of trace 460 for one or more beams, in the reconfiguration interval or one or both edges or in all three bands. During the time interval $T_R$ for the constant amplitude reconfiguration chirp, the frequency changes from $\omega_0$ 462 to $\omega_0$ 462 plus reconfiguration bandwidth $B_R$ 464. The trace 430 for the square envelope begins at a lower frequency $\omega_S$ 463 and extends to a higher frequency $\omega_F$ 465.

The sharp edges of the square envelope trace 430 cause spectral amplitude variations in frequencies throughout the reconfiguration band $B_R$ 464. The slowly rising and falling amplitude envelopes of trace 440 smooth the amplitude in the reconfiguration band $B_R$ 464 at the cost of losing available bandwidth outside $B_R$ 464, e.g., between $\omega_S$ 463 and $\omega_0$ 462, and between $\omega_F$ 465 and $\omega_0$ 462 plus $B_R$ 464.

4. COHERENCE TIME RESTRICTIONS

The coherence time of the medium restricts the coherent response to the coherent beam of photons propagating through the medium. Here is described how the coherence time puts a lower limit on the chirp rate that can be effective in reconfiguring the atomic state populations.

When the coherent electromagnetic field has frequency $\omega_1$, the atoms in the frequency range $\omega_1+/-\Delta\omega$ are also driven by the field, due to the coherence limit of the atomic transitions or laser carrier frequency or other effects, where $\Delta\omega$ is the effective coherent bandwidth for the various participants in the interaction. The coherence time $T_2$ is the reciprocal of $\Delta\omega$. The more coherent the process, the longer is $T_2$, and the narrower is $\Delta\omega$. The condition to ignore incoherent driving is given by Expressions 7a through 7f.

$$\Omega_C << \kappa T_2 \tag{7a}$$

Substituting for $\Omega_C$ using Expression 6f, for inversion, yields $$\kappa >> (1/\pi T_2)^2 \ln[2/\epsilon] \tag{7b}$$

Similarly using Expression 5e (or substituting 1 for $\epsilon$ in 7b), for erasure, yields $$\kappa >> (1/\pi T_2)^2 \ln 2 \tag{7c}$$

The material coherence time $T_2$ can be increased by various well-known methods, such as lowering doping concentrations, applying an external electromagnetic field, or lowering temperature. Such activities increase $T_2$ and allow lower chirp rates $\kappa$ to be used effectively.

5. METHOD FOR RECONFIGURING ATOMIC STATE POPULATIONS IN A FREQUENCY BAND OF INTEREST

Figure 5:
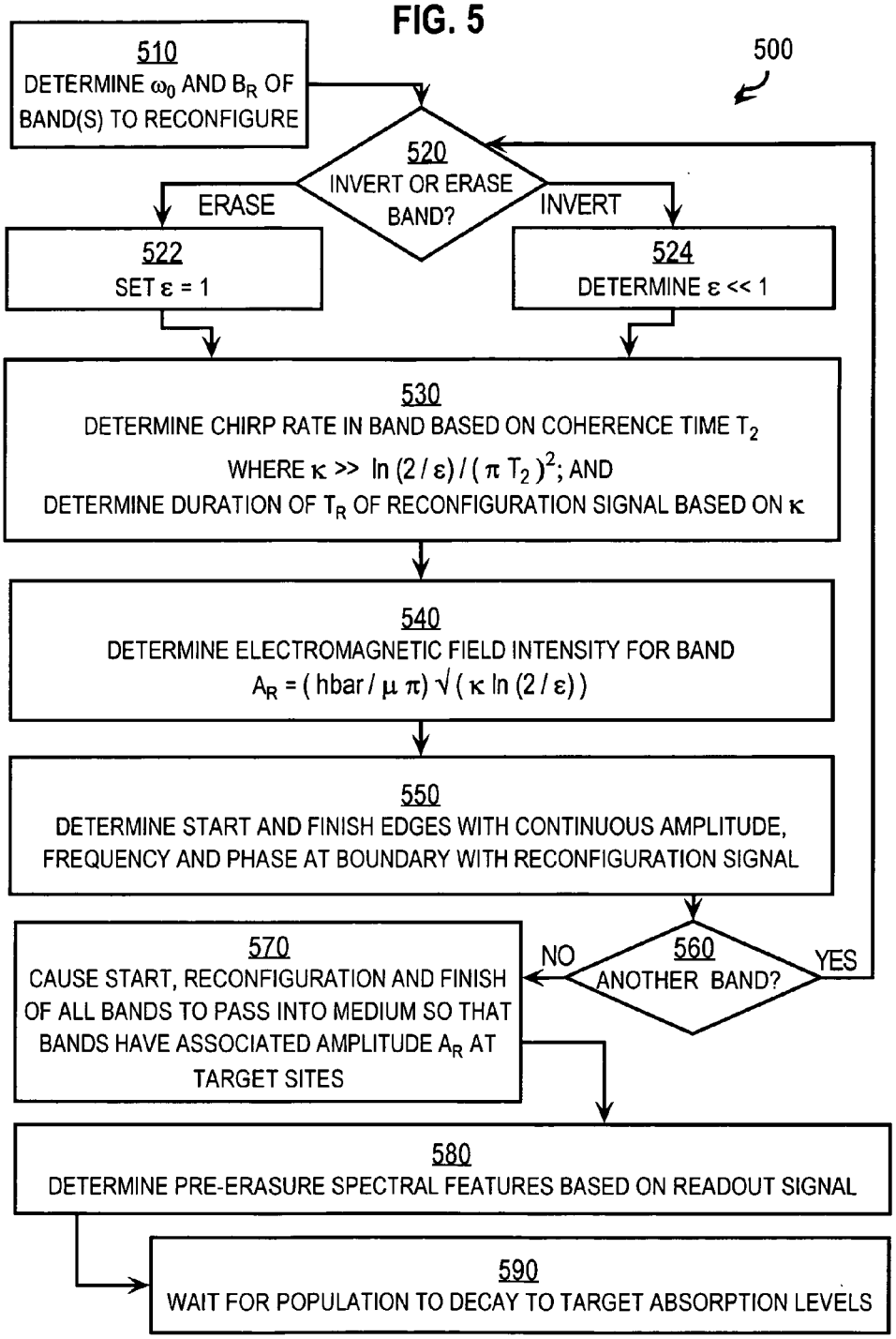
FIG. 5 is a flow diagram that illustrates at a high level a method for selectively reconfiguring populations of two atomic states in the medium, according to an embodiment.

FIG. 5 is a flow diagram that illustrates at a high level a method 500 for selectively reconfiguring populations of two atomic states in at least a portion of a medium, according to an embodiment. Although steps are shown in FIG. 5 in a particular order for purposes of illustration, in other embodiments some steps may be performed in a different order, or overlapping in time, or one or more steps may be omitted, or additional steps added, or changes can be made in some combination of ways.

In step 510, the start frequency $\omega_0$ and bandwidth $B_R$ of the frequency band to reconfigure for each of one or more frequency bands are determined.

In step 520, it is determined whether the frequency band is to be erased or inverted. If it is determined that the frequency band is to be erased, then control passes to step 522. In step 522 a value for $\epsilon$ is set to one (1), and control passes to step 530.

If it is determined in step 520 that the frequency band is to be inverted, then control passes to step 524. In step 524 a value for $\epsilon$ is set to an arbitrarily small value, and control passes to step 530. There is a tradeoff during step 524. The smaller the value of $\epsilon$ selected, in the case of infinite material coherent time $T_2$, the stronger the Amax of the chirp must be for a given chirp rate. The larger the value of $\epsilon$, the less accurately is the original spectral content represented in the inverted populations. In some circumstances due to incoherence, a particularly small value of ε cannot be achieved, as described in more detail later with reference to FIG. 11

In step 530, a minimum chirp rate is determined in the reconfiguration band based on the coherence time $T_2$, using Expression 7b or 7c, as appropriate for erasure and inversion, respectively. Once the minimum chirp rate is determined, a functional form for the chirp in the reconfiguration band is also selected using a linear or non-linear chirp rate. Based on the functional form for the chirp and the start frequency $\omega_0$ and bandwidth $B_R$ selected in step 510 for the reconfiguration band, the duration $T_R$ of the chirp in the reconfiguration band is determined.

In step 540, the constant maximum electromagnetic field amplitude $A_R$ for the reconfiguration band is determined based on Expression 5g or 6g, as appropriate for erasure and inversion, respectively.

In step 550, start and finish edges are determined to bracket the reconfiguration band. The maximum amplitude $A_S$ of the electromagnetic field oscillations during the start time interval $T_S$ increases with a substantively continuous first derivative from substantively zero at a start of the start time interval $T_S$ to $A_R$ and a substantively zero rate of change at an end of the start time interval $T_S$. Similarly, the maximum amplitude $A_F$ of the electromagnetic field oscillations during the finish time interval $T_F$ decreases with a substantively continuous first derivative from a value substantively equal to $A_R$ with a substantively zero rate of change at a start of the finish time interval $T_F$ to zero at an end of the finish time interval $T_F$.

The frequency ω(t) of the electromagnetic field oscillations at a time t during the start time interval $T_S$ changes with a substantively continuous first derivative to match a start frequency $\omega_0$ and start frequency rate of change κs at a start of the reconfiguration time interval $T_R$. Similarly, a frequency ω(t) of the electromagnetic field oscillations at a time t during the finish time interval $T_F$ changes with a substantively continuous first derivative to match an end-reconfigure frequency ωe and an end-reconfiguration frequency rate of change κe at an end of the reconfiguration time interval $T_R$. In some embodiments, the functional forms of the frequency variations in the start and finish time intervals are selected to minimize the total bandwidth in the start and finish time intervals. In some embodiments, the frequency variation in the start edge is constant and equal to κs. In some embodiments, the frequency variation in the finish edge is constant and equal to κe. In some of these embodiments, when κc is constant in the reconfiguration interval, κs=κe=κc.

A phase of the electromagnetic field oscillations during the start time interval $T_S$ changes with a substantively continuous first derivative to match a start phase and start phase rate of change at a start of the reconfiguration time interval $T_R$. Similarly, a phase of the electromagnetic field oscillations during the finish time interval $T_F$ changes with a substantively continuous first derivative to match an end-reconfiguration phase and an end-reconfiguration phase rate of change at an end of the reconfiguration time interval $T_E$.

In step 560 it is determined whether there is another frequency band to be probed or reconfigured during the same reconfiguration time interval. If so, control passes back to step 520 to determine whether the next band is to be erased or inverted. If not, control passes to step 570. In some embodiments that reconfigure only one band at one time, step 560 is omitted.

In step 570, the one or more electromagnetic chirped fields that combine the reconfiguration signal with start and finish edges are caused to pass into the medium so that the reconfigured frequency bands have the associated amplitude $A_R$ at the target site. When the medium is thin or non-attenuating, the beam can be incident with the value of $A_R$ in the reconfiguration band. However, when the medium is thick or heavily attenuating, the incident beam must be amplified so that after any attenuation during passage to a target site in the medium, the amplitude in the reconfiguration band (and matching amplitudes in the start and finish bands) have the value computed in steps 540 and 550.

As a result of step 570, the selected one or more frequency bands are reconfigured. In some embodiments, control passes to step 580 to receive a readout signal and determine pre-erasure spectral features based on the readout signal. In such embodiments, the chirp that erases the spectral features also causes a readout signal. The generation and processing of the readout signal is described in Merkel; and in U.S. patent Ser. No. 11/179,765 filed Jul. 12, 2005 entitled "Techniques for Recovering Optical Spectral Features Using a Chirped Optical Field," by T. Chang, M. Tian, W. R. Babbitt and K. Merkel (hereinafter Chang), the entire contents of which are hereby incorporated by reference as if fully set forth herein. In some embodiments, step 580 is omitted.

In the illustrated embodiment, method 500 includes step 590. In step 590, the process waits for the population to decay to a desired (target) absorption level. For example to get to a desired relative population rd after erasure, the process waits a time $T_W$ given by Expression 2b.

In some embodiments control passes back to step 510 after step 590 to reprocess the same band at a different time. For example, in some embodiments to achieve a relative population of about −rd, after waiting a time $T_W$ given by Expression 2b during step 590, control passes back to step 510 to invert the same frequency band.

6. EXAMPLE EMBODIMENTS

Figure 6:
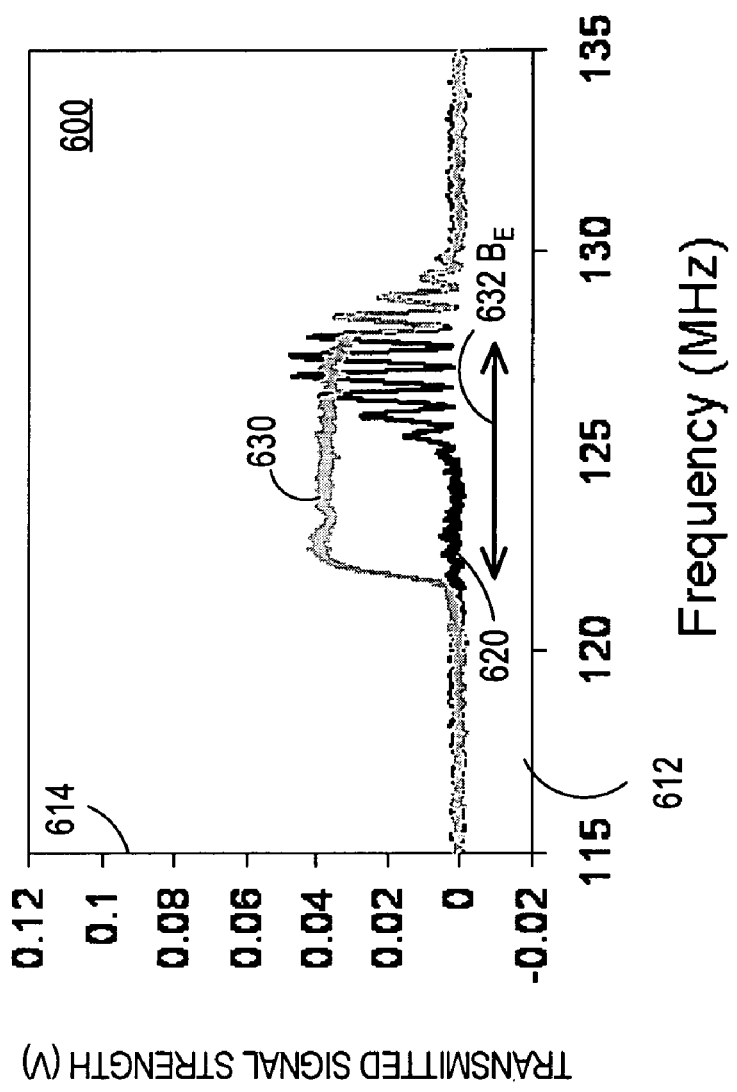
FIG. 6 is a graph that illustrates measured transmission signal through a medium with a spectral grating before and after erasure in a selected frequency band.

FIG. 6 is a graph 600 that illustrates measured transmitted signal strength through a medium with a spectral grating before and after erasure in a selected frequency band. The horizontal axis 612 is frequency deviations from an optical carrier frequency in MegaHertz (MHz, 1 MHz=$10^6$ cycles per second). The vertical axis 614 is detected transmitted signal strength in volts. In such a graph, transmitted signal strength is low for r near −1, high (about 0.04 volts) for transparent conditions with r near 0, and very high (about 0.10 volts) for gain conditions with r near +1. Trace 620 shows the effect of a spectral grating in the medium at frequency deviations between 125 and 130 MHz. It was determined to erase the features in a reconfiguration band with bandwidth $B_E$ 632 from about 122 MHz to about 128 MHz. Trace 630 shows the effect of erasure. The spectral grating is not in evidence in the erasure band marked by bandwidth $B_E$, and is still evident above about 128 MHz.

In this example, the spectral grating was burned into the IBT material using interacting fields, such as fields 115. The electromagnetic chirped field 125 includes a constant amplitude reconfiguration signal that is a linear chirp and includes hyperbolic secant start and finish edges. The linear chirp in the reconfiguration band has a constant chirp rate of κ=1 MHz/µs and has a Rabi frequency $\Omega_C$=µ Amax/hbar given by Expression 5f of 265 kiloHertz (kHz, 1 kHz=$10^3$ cycles per second) suitable for erasure (ε=1).

In practice at optical frequencies, the quantity Amax is not measured directly but is derived from measurements of the power (P) and radius (s) of the optical beam, as given in Expression 8a.

$$A\max = Z^* \sqrt{(P/(\pi s^2))} \quad (8a)$$

where Z is a proportionality factor that depends on material. The Rabi frequency is observable. For a given material, the factor of proportionality between the Rabi frequency and Amax is proportional to $Z^*\mu/\hbar bar$ converted to the units of choice and can be determined by experiment. For Tm:YAG, the material used in the measurements depicted in FIG. 6 (and in FIG. 7, described below), the proportionality factor at ω corresponding to a wavelength of 793 nm is 570 (Hz/sqrt(Watts/m$^2$)). Thus, for this material $$\Omega_C = 570(Hz/sqrt(Watts/m^2))^* \sqrt{(P/(\pi s^2))} \quad (8b)$$

where the Rabi frequency is in Hz. Other materials and transitions may have different values, which scale with the dipole moment of the transition of interest. As an example, a 100 micron (1 micron=$10^{-6}$ m) diameter optical beam of power 7 milliWatts (mW, 1 mW=$10^{-3}$ Watts) that is resonant with 793 nm transition in Tm:YAG results in a Rabi frequency of 270 kHz.

Including hyperbolic secant start and finish edges, the amplitude of the coherent electromagnetic chirped field as a function of time is given by Expression 9a, where $T_S = T_F = 2T_H$, where $T_H$ is the half width of the edge intervals.

$$A(t) = \begin{cases} A\max \operatorname{sech}\{(t-t_0)/T_H\} & t_0 - 2T_H < t < t_0 \\ A\max & t_0 \leq t \leq t_0 + T_R \\ A\max \operatorname{sech}\{(t-t_0-T_R)/T_H\} & t_0 + T_R < t < t_0 + T_R + 2T_H \end{cases} \quad (9a)$$

Including non-linear frequency functions in the start and finish edges, the frequency ω(t) is given by Expression 9b.

$$\omega(t) = \quad (9b)$$
$$\begin{cases} \omega_0 - \kappa T_R/2 + \kappa T_H \tanh\{(t-t_0)/T_H\} & t_0 - 2T_H < t < t_0 \\ \omega_0 + \kappa\{t - t_0 - T_R/2\} & t_0 \leq t \leq t_0 + T_R \\ \omega_0 + \kappa T_R/2 + & t_0 + T_1 < t < t_0 + T_R + 2T_H \\ \kappa T_H \tanh\{(t-t_0 - T_R)/T_H\} & \end{cases}$$

With these functional forms, the amplitude, frequency, rate of change of frequency (chirp rate) and phase are continuous in time; and thus leave the amplitude flat in the reconfiguration frequency band, as can be determined by the Fourier transform of the above functions. Since the use of a hyperbolic chirp minimizes the bandwidth devoted to the edges, the excitation spectrum is both uniform in the reconfiguration band and sharp edged.

For the erasure shown in FIG. 6, $T_R$ was 5 μs and $T_H$ was 0.5 μs.

Before and after erasure, a linear chirp with chirp rate of 0.05 MHz/μs, duration of 400 μs, and Rabi Frequency of 32 kHz was used for readout of spectral features. This Rabi frequency corresponds to a low amplitude chirp (about one eighth the amplitude Amax of the erasure chirp) that does not reconfigure the atomic state populations.

Figure 7:
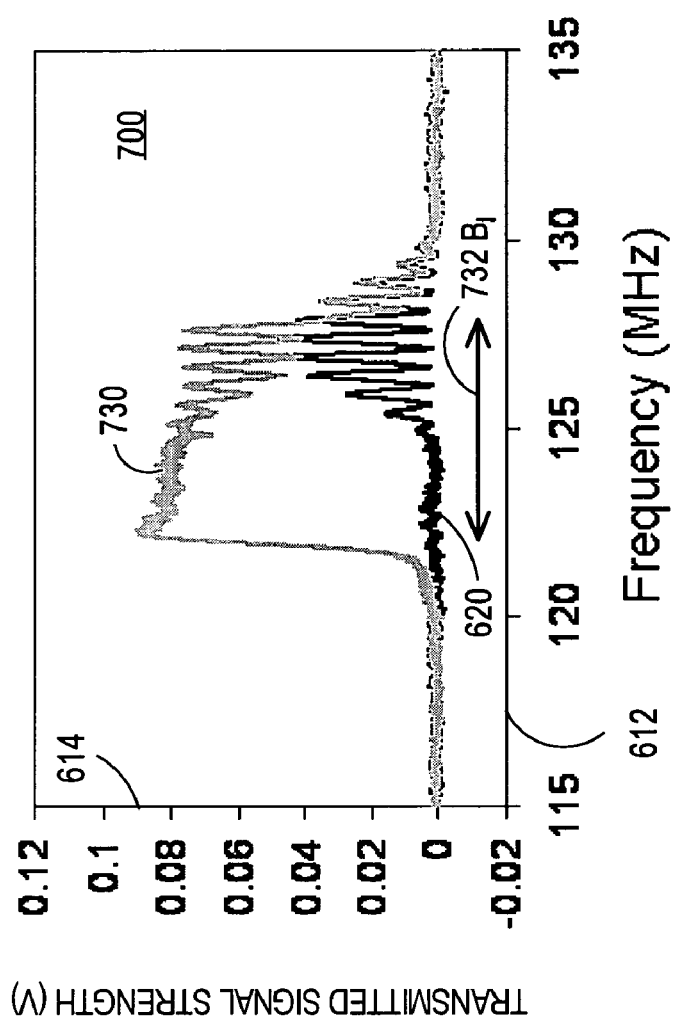
FIG. 7 is a graph that illustrates measured transmission signal through a medium with a spectral grating before and after inversion in a selected frequency band.

FIG. 7 is a graph 700 that illustrates measured transmitted signal strength through a medium with a spectral grating before and after inversion in a selected frequency band. The horizontal axis 612, vertical axis 614 and trace 620 are as described above for graph 600. It was determined to invert the spectral features in reconfiguration band with bandwidth $B_I$ 732 from about 122 MHz to about 128 MHz. Trace 730 shows the effect of inversion. The medium is a pure gain medium, inverted from a pure absorbing medium from 122 MHz to the start of the grating at 125 MHz. From 125 MHz to about 128 MHz, the spectral grating is in evidence but inverted with amplified transmitted signal strength levels indicative of gain. At frequencies above the inverted band marked by bandwidth BI, above about 128 MHz, the original spectral grating is still evident.

As in FIG. 6, the spectral grating is burned into the IBT material using interacting fields, such as fields 115. The electromagnetic chirped field includes a constant amplitude reconfiguration signal that is a linear chirp and includes hyperbolic secant start and finish edges. The linear chirp in the reconfiguration band has a constant chirp rate of κ=1 MHz/μs and has a Rabi frequency $\Omega_C = \mu$ Amax/$\hbar bar$ given by Expression 6f of 730 kHz suitable for inversion with $\epsilon \approx 0.01$.

Including hyperbolic secant start and finish edges, the amplitude of the coherent electromagnetic chirped field as a function of time is given by Expression 9a, where $T_S = T_F = 2T_H$. With the start and finish edges, the frequency ω(t) is given by Expression 9b. As in FIG. 6, for the inversion shown in FIG. 7, $T_R$ was 5 μs and $T_H$ was 0.5 μs.

Also as described above for FIG. 6, before and after inversion, a linear chirp with chirp rate of 0.05 MHz/μs, duration of 400 μs, and Rabi Frequency of 32 kHz was used for readout of spectral features. This Rabi frequency corresponds to a low amplitude chirp (about one twentieth the amplitude Amax of the inversion chirp with $\epsilon$=0.01) that does not reconfigure the atomic state populations.

Other experiments were carried out to selectively erase and invert single and multiple spectral holes in the IBT material 150. Similar results were obtained and are not reported here as being cumulative.

Simulations were also carried out to experiment with the effects of different edge functional forms. Among the functional forms demonstrated to perform adequately was a cosine edge function of the form, given by Expression 10.

$$A_S(t) = \{\operatorname{cosine}\ [\pi(t-t_0)/T_S] + 1\}A_E/2\ \text{for}\ t_0 - T_S < t < t_0 \quad (10a)$$

$$A_F(t) = \{\operatorname{cosine}\ [\pi(t-t_0-T_R)/T_F] + 1\}A_E/2\ \text{for}$$
$$t_0 + T_R \leq t \leq t_0 + T_R + T_F \quad (10b)$$

In some of these simulations, a constant chirp rate κ is used throughout the electromagnetic chirped field, including both start and finish edges.

Figure 8:
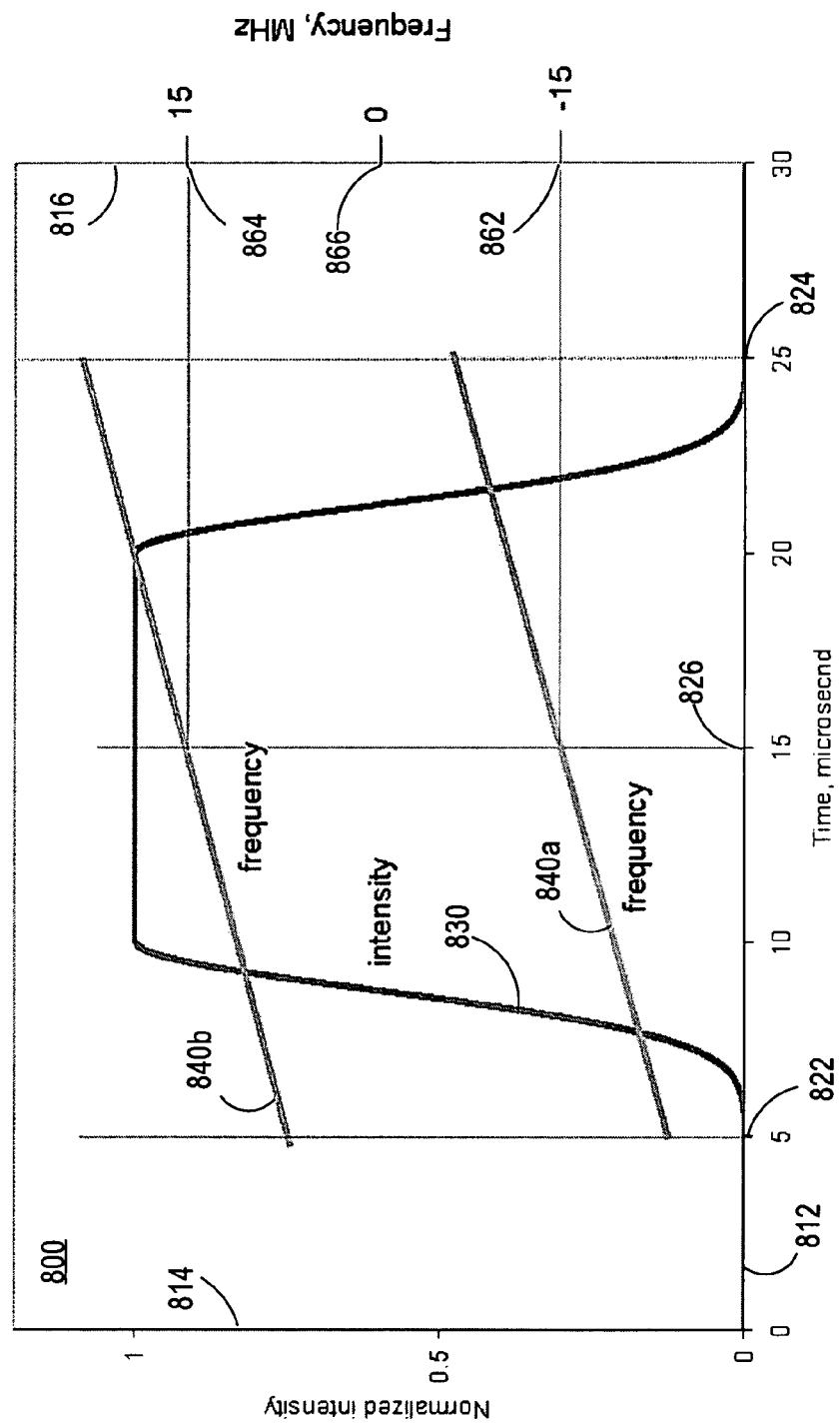
FIG. 8 is a graph that illustrates multiple simultaneous chirps used to reconfigure multiple frequency bands in a medium, according to an embodiment.

FIG. 8 is a graph 800 that illustrates multiple simultaneous chirps used to reconfigure multiple frequency bands in a medium, according to an embodiment. The horizontal axis 812 is time in μs. The left side vertical axis 814 is normalized intensity in which 1 corresponds to Amax for a population reconfiguration of interest. The right side vertical axis 816 is frequency deviations in MHz from an optical carrier frequency 866. The atomic state populations in two frequency bands are reconfigured with this field plotted in FIG. 8. A first band centered at −15 MHz 862 is reconfigured by the chirp 840*a*, and a second band centered at +15 MHz 864 is reconfigured by chirp 840*b*. Both chirps are modulated in amplitude by the intensity curve 830 between 5 μs and 25 μs 824. The reconfiguration chirp duration is 10 μs from 10 μs to 20 μs, with 5 μs duration start and finish edges. Both frequency bands are reconfigured at the same time.

In the illustrated embodiment, both frequency bands are reconfigured with chirps of the same linear chirp rate κ. Therefore, if both are erasures, the value of Amax represented by normalized intensify value of 1 is the same for both chirps. If one is erasure and the other is inversion, then the value of Amax represented by normalized intensify value of 1 is different for the two chirps. The value corresponding to a normalized intensity value of 1 is greater for the frequency band to be inverted. Similarly, if the chirp rates were different for the two bands, since Amax depends on κ, the values of Amax corresponding to a normalized intensity value of 1 would be different for the two frequency bands.

Figure 9:
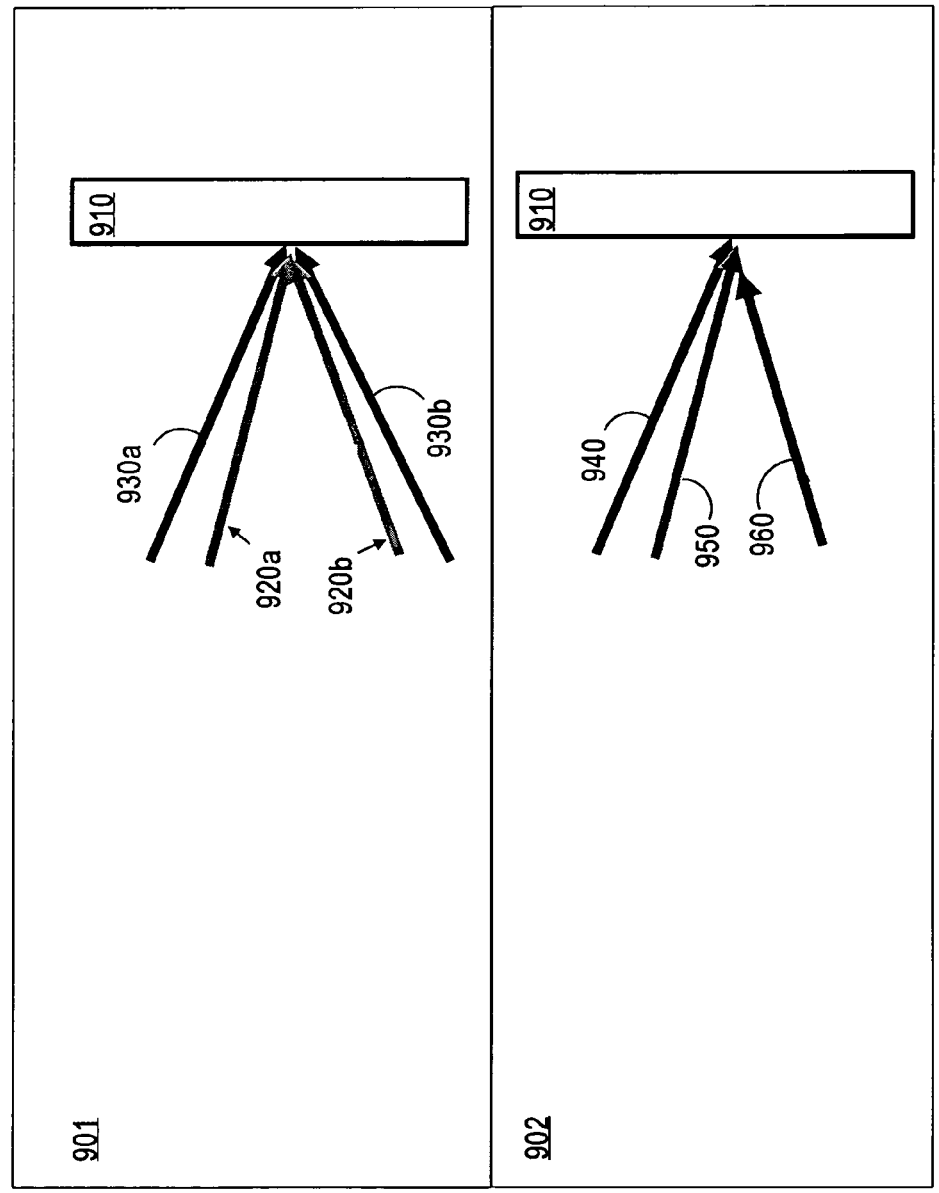
FIG. 9A and FIG. 9B are block diagrams that illustrates multiple chirps in different spatial modes used to reconfigure a medium, according to an embodiment.

Chirped fields used to erase spectral features may themselves interact with subsequent signals intended for reprogramming the medium because of the atomic memory over coherence times. To reduce this effect, it may be desirable to use different spatial modes for reprogramming signals. FIG. 9A and FIG. 9B are block diagrams that illustrates multiple chirps in different spatial modes used to reconfigure a medium 910 according to embodiments 901 and 902.

In embodiment 901 depicted in FIG. 9A, two sets of angled beams are used. One set programs the material by imposing spectral content while the other set erases spectral content in different spatial modes. Then the two sets switch, with the first set erasing in those spatial modes while the second set programs the different spatial modes. For example, at an initial time the first set of beams 920a and 920b interact to program the medium 910 with spectral contents in a first spatial mode. At a later time, when processing of that spectral content is completed, one or both of the first set of beams 920a and 920b send an erasure chirp into the medium 910 along the first spatial mode. Instead of waiting for the coherence time to reprogram the medium 910, the second set of beams 930a and 930b interact to program the medium 910 with new spectral content in a different second spatial mode. At successively later times, the first set 920a, 920b and the second set 930a, 930b, alternate in programming and erasing the medium. In this way, a user need not wait for the coherence time before reusing the medium 910.

In embodiment 902 depicted in FIG. 9B, multiple single spatial modes 940 and 950 are use for programming. A single channel 960 is used for erasure. As one spatial mode, e.g., 940 is erased by mode 960, the other spatial mode 950 is being programmed with new spectral content.

Figure 10:
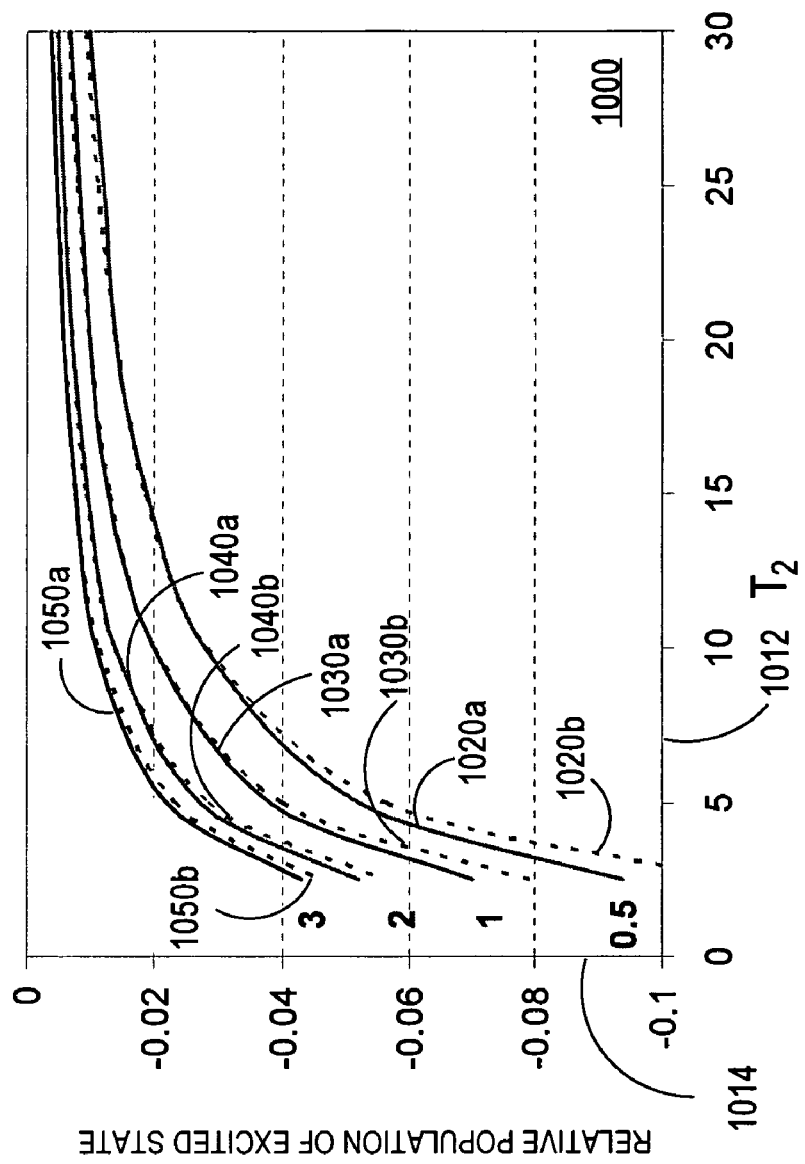
FIG. 10 is a graph that illustrates the effect of coherence time on the selection of a chirp rate for erasure, according to an embodiment.

FIG. 10 is a graph 1000 that illustrates the effect of coherence time on the selection of a chirp rate for erasure, according to an embodiment. The horizontal axis 1012 is coherence time $T_2$, described above, in µs. The vertical axis 1014 is relative population of excited state r, also defined above. The different traces 1020a, 1030a, 1040a, 1050a correspond to different chirp rates of 0.5, 1, 2 and 3 MHz/µs, respectively. For a given coherence time $T_2$, the higher chirp rates more closely attain an r value of zero that provides erasure. Perfect erasure corresponds to infinite coherence time or infinite chirp rate. Practical erasure is achieved with moderately high values of $T_2 > 15$ µs and chirp rate κ>3 MHz/µs. The dashed traces 1020b, 1030b, 1040b, 1050b are analytical fits to different chirp rates of 0.5, 1, 2 and 3 MHz/µs, respectively, using an equation of the form of Expression 11.

$$r(\omega,tf)=-\xi\Omega_C(\text{erasure})/\kappa T_2 \quad (11)$$

The plotted fits are achieved with a value of ξ=0.75. Expression 11 and FIG. 10 are consistent with the inequality given in Expression 7c.

Figure 11:
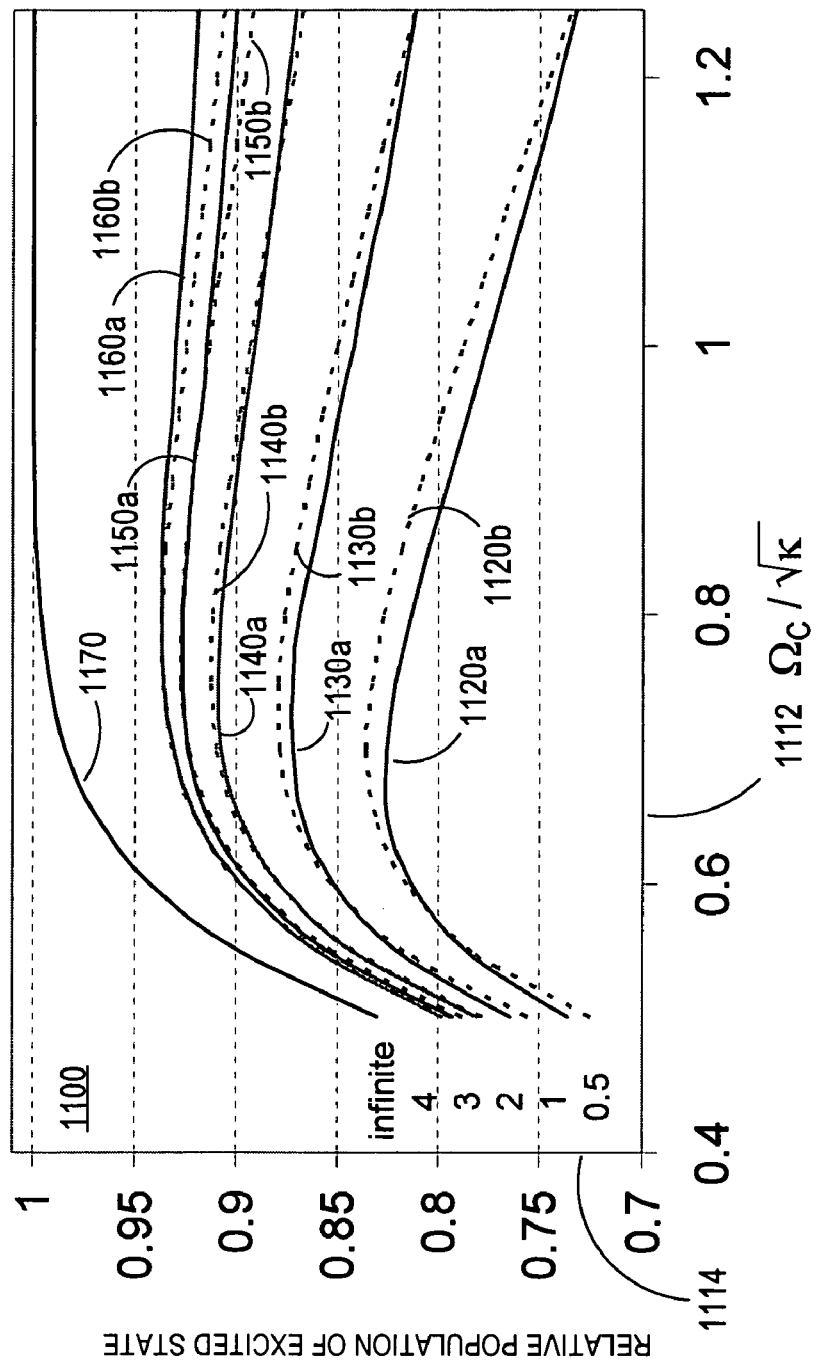
FIG. 11 is a graph that illustrates the effect of coherence time on the selection of a chirp rate for inversion, according to an embodiment.

FIG. 11 is a graph 1100 that illustrates the effect of coherence time on the selection of a chirp rate for inversion, according to an embodiment. The horizontal axis 1112 is normalized Rabi frequency $\Omega_C/\sqrt{\kappa}$, described above, which is dimensionless. The vertical axis 1114 is relative population of excited state r, also defined above. The different traces 1120a, 1130a, 1140a, 1150a, 1160a, 1170 correspond to different chirp rates of 0.5, 1, 2, 3, 4 and infinite MHz/µs, respectively, for a coherence time $T_2$ of 16 µs. The dashed traces 1120b, 1130b, 1140b, 1150b, 1160b are analytical fits to different chirp rates of 0.5, 1, 2, 3 and 4 MHz/µs, respectively, using an equation of the form of Expression 12.

$$r(\omega,tf)=(1-2\Theta)r(\omega,ti)-\xi\Omega_C(\text{inversion})/\kappa T_2 \quad (12)$$

The plotted fits are achieved with a value of ξ=2.4. For several chirp rates, best inversion is achieved at normalized Rabi frequencies between about 0.7 and 0.8.

FIG. 11 indicates that some chirp rates may not be practical if the difference from perfect inversion, ε, is set too small or the coherence time is too short. The maximum chirp rate may be limited by the laser power and the other hardware components. Thus the maximum inversion for normalized Rabi frequencies between about 0.7 and 0.8 has important practical application.

Figure 12:
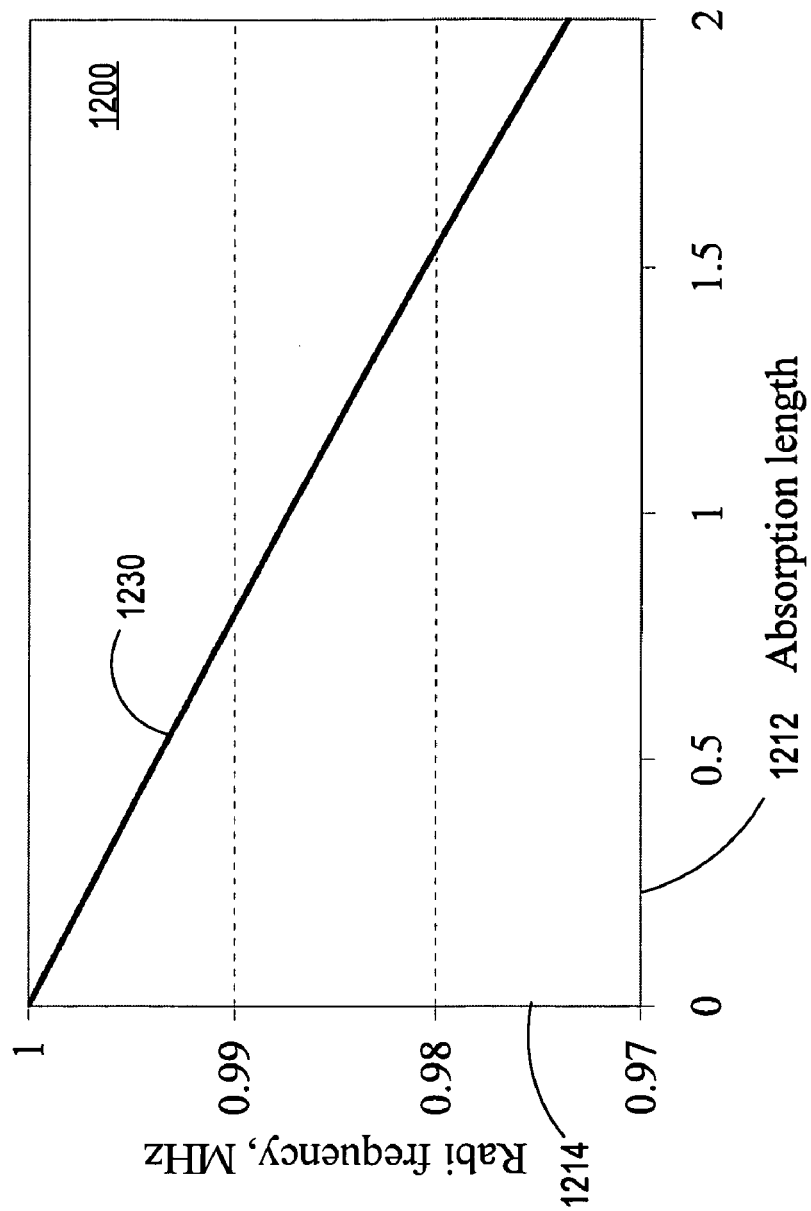
FIG. 12 is a graph that illustrates the effect of absorption length on amplitude expressed as a Rabi frequency.

FIG. 12 is a graph 1200 that illustrates the effect of absorption length on amplitude expressed as a Rabi frequency. The vertical axis 1214 is Rabi frequency, which is proportional to Amax. The horizontal axis 1212 is absorption length, equal to the thickness of the medium times the coefficient of absorption α. For weak field, the coefficient of absorption α is defined by equations of the form of Expression 13a for intensity I(x) at distance x into the medium $$I(x)=I(0)\exp(-\alpha x) \quad (13a)$$

and for amplitude A(x) at distance x by Expression 13b $$A(x)=A(0)\exp(-\alpha x/2) \quad (13b)$$

The absorption length L of a distance x is given by Expression 13c $$L(x)=x*\alpha \quad (13c)$$

Thus when L=1, the field intensity is 1/e of the incident intensity, and when L=2 field amplitude becomes 1/e of the incident amplitude.

For weak field, an exponential decay trace is expected. However, for strong field, due to the field induced transparency effect, the attenuation of the incident field though the propagation is much less than that of weak field. The trace 1230 indicates how Amax is attenuated with depth in an absorbing medium for a strong field. FIG. 12 is based on measurements made for an inversion chirped electromagnetic field with an incident Rabi frequency of 1 MHz and a chirp rate of 1 MHz/µs.

For a given Amax to be effective for erasure or inversion, it must have that value at the depth in the medium to be erased or inverted. To account for attenuation, the incident beam may have to have an Amax (and Rabi frequency) greater than the Amax desired at the target site.

In this respect inversion of a thick medium is easier. Erasure involves a narrow range of Amax values. For inversion, however, any amplitude above Amax for inversion is also effective at inversion. Thus, to invert all of a thick medium, it is only required to select an incident beam Amax that will not be attenuated below the minimum Amax for a selected degree of inversion ε. As graph 1200 shows, a 3% increase in Amax is sufficient to invert the entire thickness of a medium with absorption length of 2.

Figure 13:
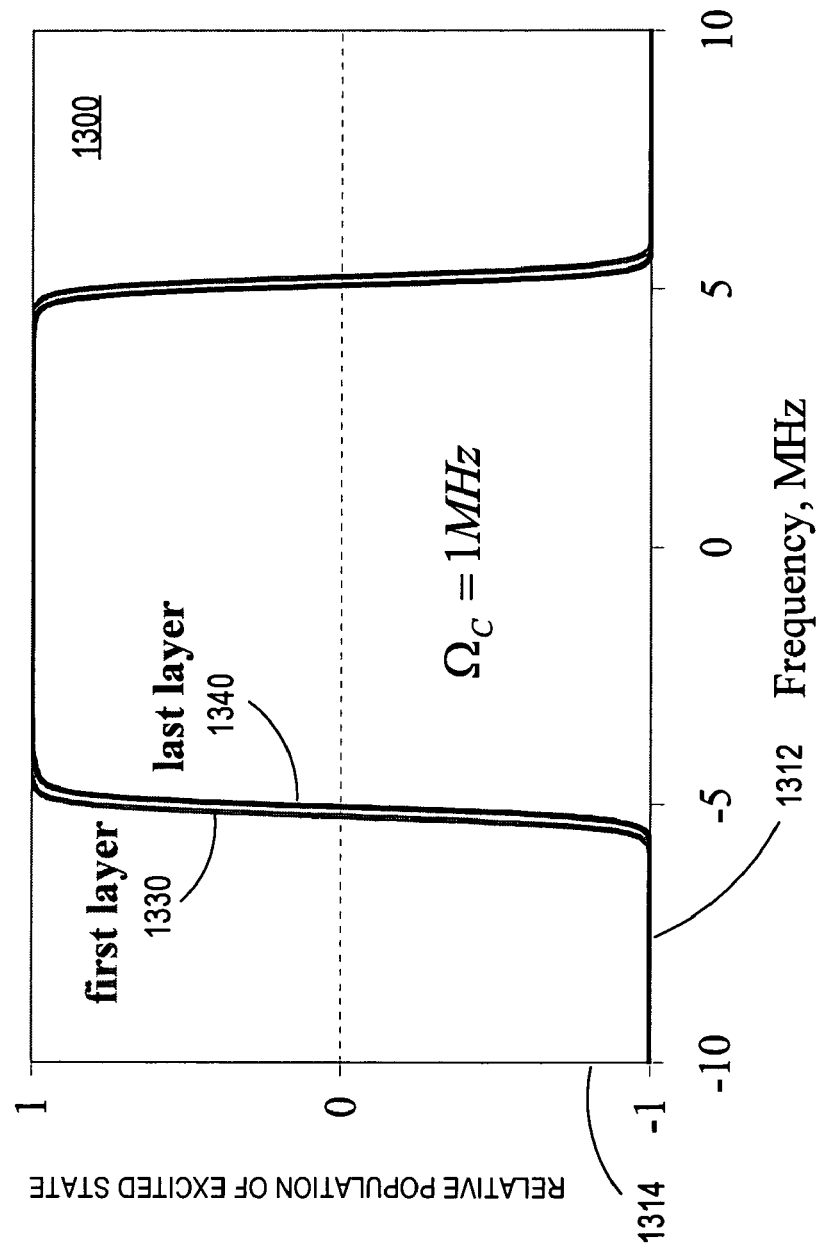
FIG. 13 is a graph that illustrates the relative population of the excited state versus frequency for a given Rabi frequency.

FIG. 13 is a graph 1300 that illustrates the relative population of the excited state r versus frequency for a given incident Rabi frequency over a 10 MHz reconfiguration band. The horizontal axis 1312 is frequency ω in MHz; and the vertical axis is relative population of excited state r. Trace 1330 shows the population inversion achieved in the first layer of the medium of absorption length L=2, before attenuation. Trace 1340 shows the population inversion achieved in the last layer of the medium, after 3% attenuation. It is noted that inversion is still very close to 100% and very flat over almost the full 10 MHz bandwidth of the reconfiguration band.

To erase completely such a medium requires an Amax given by Expression 5g over the full thickness of the medium. This can be achieved with a series of erasure chirps. Each erasure chirp is incident at a different amplification over the target Amax for erasure so that each reaches the target Amax for erasure at different depths in the medium. In some embodiments, different erasure chirps are incident on the medium in different directions; so that erasure can be accomplished from both sides. Simulations have shown the viability of this approach, but are not presented here.

The descriptions presented above are for systems with two atomic states. Many atomic systems include additional states that are also occupied. It is expected that erasure and inversion can be accomplished in such systems provided that the time of occupancy in the additional states is limited or controllable.

7. MEDIUM ABSORPTION CONTROL

In some of the IBT material based applications, the performances of the material depends on the optical thickness, also called total absorption length, which is the integration of the absorption coefficient, α, over the physical length of the material, Lmat. For a constant absorption coefficient α the optical thickness is simply αLmat.

The absorption coefficient of the medium is proportion to absorbers concentration and the population inversion of the absorbers, $\alpha(\omega)=-\alpha_0 r(\omega)$, where $\alpha_0$ is defined as the absorption coefficient for the population at ground state (i.e., r=−1) in a particular frequency band of interest. For a given medium, the absorption coefficient can be adjusted by varying the population inversion level as a function of frequency. The present population reconfiguration techniques can be used for effective absorption control and adjustment. By combining reconfiguration of atomic state populations with population decay, the effective absorption can be adjusted in selected spectral bands and locations within the medium within a short time.

These procedures can be used to form transparent windows for spectral filtering and for inversion of an absorbing medium to a gain medium. If the relative population r is initially uniform over the bandwidth of interest, either inversion or erasure can be used as the first operation. If there are any spectral features initially, then erasure is preferably used as the first operation.

If the frequency bandwidth of interest is comparable with inhomogeneous broadening, the inhomogeneous broadening profile affects the overall absorption. For example, if the initial absorption profile has a Gaussian shape, the adjusted profile also has the Gaussian shape.

8. COMBINATION CHIRPS

In some applications, one or more chirped pulses are used for processing or readout of spectral features. For example, a chirp that is used for readout can also be used for erasure so that the readout and erasure can be implemented simultaneously. This combined operation has the advantages of reducing the number of operations and shortening the operation time.

The chirped field used in the erasure may also be used for reprogramming the next spatial-spectral features. The erasure and reprogramming chirps can be temporally separated or temporal overlapped.

In some applications, the chirp bandwidths for inversion, readout, and erasure are the same, and constitute the bandwidth of interest. It is convenient to use a series of chirps with varied amplitude for inversion, readout, and erasure. For example, in most applications, the spectral features stored in the material are in the absorptive range, and the inversion of these absorptive spectral features results in amplified readout signals. After readout, the spectral features in gain regime can then be erased. In some embodiments, the series of chirps are repeated to implement the inversion/readout/erasure operations. In some embodiments, the chirps are combined. For example, the readout and erasure are combined and implemented using one chirp. As another example, the inversion and the readout chirps are combined.

In the erasure of strong spectral features, especially spectral gratings with high strength, the erasure field will be diffracted by the spectral features. In some applications where high dynamic range is desired, this diffraction should be considered. In some embodiments, two or more chirps are used each with effective erasure amplitudes. After the first erasure pulse, some small spectral features remain due to the secondary effect of diffraction. The second chirp is used for erasing the small spectral features. In most embodiments, two erasure steps are enough. In some embodiments more erasures are used. The chirps in this technique are different than the multiple chirps used in thick medium, where two or more chirps with different amplitudes are used to account for different attenuations to different spots in the material.

9. EXAMPLE APPLICATIONS

A spatial-spectral holographic (SSH) medium is usually absorptive, which reduces the performance of SSH based applications. Using inversion, absorptive SSH material can be converted into a gain medium without degradation of the information carried by the existing SSH features. In some SSH based applications, a gain medium is preferred over an absorptive one. One such application is to process extremely weak and noisy signals, such as the return signals captured by a laser RADAR receiver. A gain medium has several advantages including, 1) processing gain (instead of loss accompanied by absorptive media); 2) compactness by incorporating signal processing and amplification in one element; 3) better noise figure compared to systems with separate processing and amplification elements; and 4) flexible temporal, spectral, and spatial configurations for various signal processing requirements, such as impulsive and/or continuous signals, integrated processing through accumulation, multiple spectral and/or spatial channel operations, and collinear and/or angled spatial arrangements.

These operations are applicable to both optically thin and thick media. It is more important to achieve high gain for various signal processing applications in thick media. On the other hand, quantum computing systems most likely use thin media. The technique can be used to operate on multiple spatial and/or spectral channels. Temporal overlapped multiple chirped pulses can be configured to reduce the time to prepare inversion for multiple channel operation.

Light controlled population inversion and transfer between the energy levels of atoms is also a highly demanded technique in the areas of quantum computing and quantum control.

The erasure technique is critical to high speed, high density, continuous optical storage/processing applications based-on Optical Coherent Transients (OCT) and Spectral Hole Burning (SHB). The technique erases spatial-spectral features by setting the relative population r to zero on the order of the coherence time of the medium, which is much faster than population decay time. This erasure technique can be applied to many OCT/SHB processing applications, such as spectral-spectral coherent integrated processor, spectral analyzer, spectral filtering, optical memory, and networking using one or more OCT processing routers. In these applications, the spatial-spectral channels are repetitively swept to achieve high capacity and high speed. Due to the lifetime of the absorptive features in the medium (usually the excited state population lifetime) the same channel can be reused only after the affects from the previously processed signals vanish. Any residual of the previous processing leads to crosstalk with the following processing.

These techniques can also be applied to selectively erase a strong jammer and preserve the desired signal in RADAR signal processing in other bands.

This technique can be used to switch the processing medium to be temporarily transparent in selected spatial-spectral channels. After erasure, the medium becomes transparent.

In most applications, one crystal is used. This crystal may be used for different purposes or for different processing operations. For example, the crystal is used both for laser stabilization and for processing using the stabilized laser, as shown in FIG. 1. These two processes may require different absorption coefficients in the crystal. In some applications of signal processing, the processing requires different absorption coefficient for different signal strengths or different settings. In some embodiments, the effective absorption coefficient is adjusted to satisfy different requirement within one crystal.

Furthermore, an adjustable spectral filter has applications such as but not limited to pulse shaping and optical spectral filtering.

The techniques of the present invention can be applied to nuclear magnetic resonance (NMR) related applications and devices. The chirp in NMR is a chirped magnetic field. In these embodiments, the inversion method is used to invert the spectral features of the spin population. The erasure method is used to erase the spectral features of the spin population. The effective spin population inversion is controlled and adjusted using inversion and erasure combined with the decay process. In various embodiments, the linear and non-linear chirps described above, such as the chirp with hyperbolic secant edges, are used in NMR related applications and devices.

10. CONTROLLER HARDWARE OVERVIEW

Figure 14:
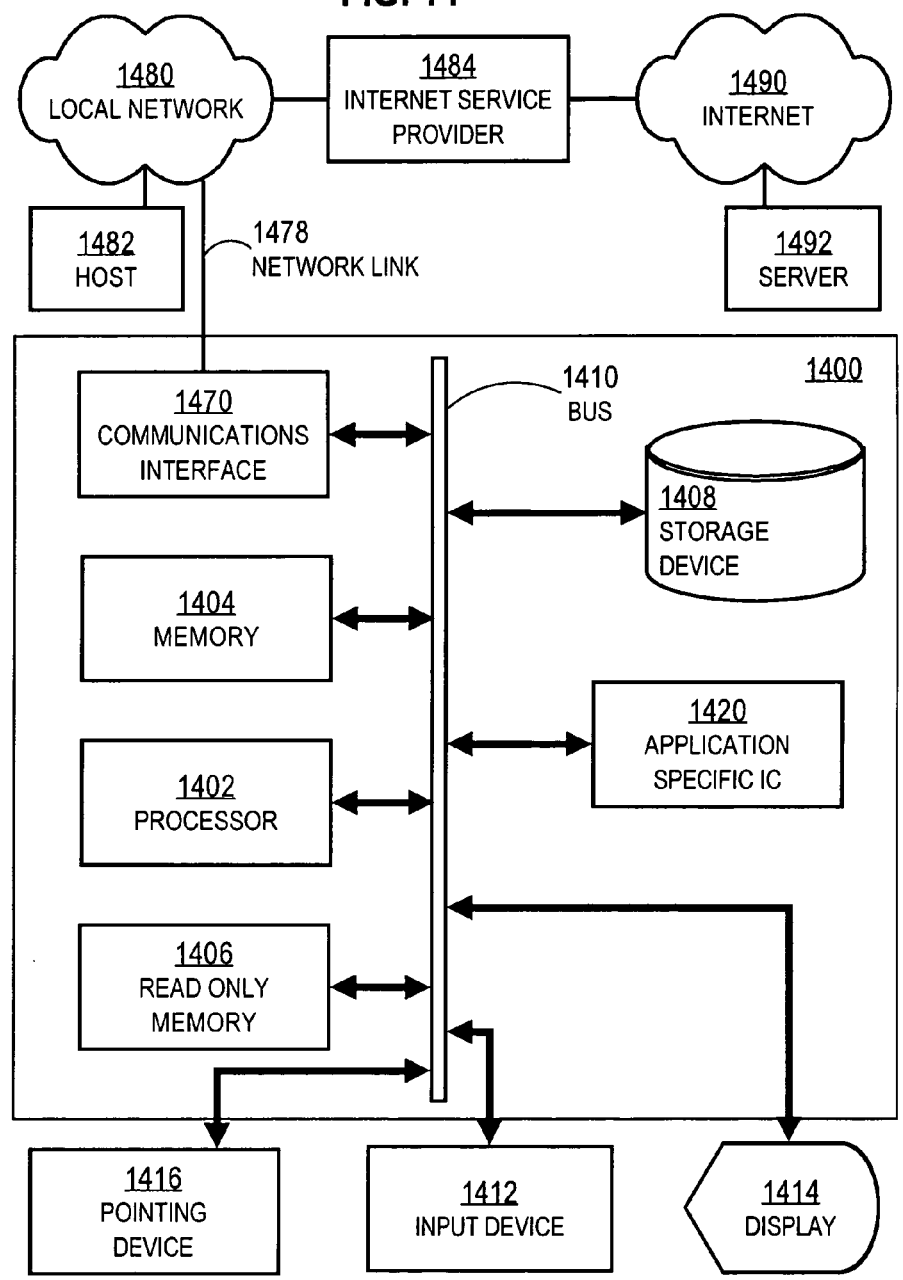
FIG. 14 is a block diagram that illustrates a computer system upon which an embodiment of the invention may be implemented as controller.

FIG. 14 is a block diagram that illustrates a computer system 1400 upon which an embodiment of the invention may be implemented as controller 102. Computer system 1400 includes a communication mechanism such as a bus 1410 for passing information between other internal and external components of the computer system 1400. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). A sequence of binary digits constitutes digital data that is used to represent a number or code for a character. A bus 1410 includes many parallel conductors of information so that information is transferred quickly among devices coupled to the bus 1410. One or more processors 1402 for processing information are coupled with the bus 1410. A processor 1402 performs a set of operations on information. The set of operations include bringing information in from the bus 1410 and placing information on the bus 1410. The set of operations also typically include comparing two or more units of information, shifting positions of units of information, and combining two or more units of information, such as by addition or multiplication. A sequence of operations to be executed by the processor 1402 constitute computer instructions.

Computer system 1400 also includes a memory 1404 coupled to bus 1410. The memory 1404, such as a random access memory (RAM) or other dynamic storage device, stores information including computer instructions. Dynamic memory allows information stored therein to be changed by the computer system 1400. RAM allows a unit of information stored at a location called a memory address to be stored and retrieved independently of information at neighboring addresses. The memory 1404 is also used by the processor 1402 to store temporary values during execution of computer instructions. The computer system 1400 also includes a read only memory (ROM) 1406 or other static storage device coupled to the bus 1410 for storing static information, including instructions, that is not changed by the computer system 1400. Also coupled to bus 1410 is a non-volatile (persistent) storage device 1408, such as a magnetic disk or optical disk, for storing information, including instructions, that persists even when the computer system 1400 is turned off or otherwise loses power.

Information, including instructions, is provided to the bus 1410 for use by the processor from an external input device 1412, such as a keyboard containing alphanumeric keys operated by a human user, or a sensor. A sensor detects conditions in its vicinity and transforms those detections into signals compatible with the signals used to represent information in computer system 1400. Other external devices coupled to bus 1410, used primarily for interacting with humans, include a display device 1414, such as a cathode ray tube (CRT) or a liquid crystal display (LCD), for presenting images, and a pointing device 1416, such as a mouse or a trackball or cursor direction keys, for controlling a position of a small cursor image presented on the display 1414 and issuing commands associated with graphical elements presented on the display 1414.

In the illustrated embodiment, special purpose hardware, such as an application specific integrated circuit (IC) 1420, is coupled to bus 1410. The special purpose hardware is configured to perform operations not performed by processor 1402 quickly enough for special purposes. Examples of application specific ICs include graphics accelerator cards for generating images for display 1414, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1400 also includes one or more instances of a communications interface 1470 coupled to bus 1410. Communication interface 1470 provides a two-way communication coupling to a variety of external devices that operate with their own processors, such as printers, scanners and external disks. In general the coupling is with a network link 1478 that is connected to a local network 1480 to which a variety of external devices with their own processors are connected. For example, communication interface 1470 may be a parallel port or a serial port or a universal serial bus (USB) port on a personal computer. In some embodiments, communications interface 1470 is an integrated services digital network (ISDN) card or a digital subscriber line (DSL) card or a telephone modem that provides an information communication connection to a corresponding type of telephone line. In some embodiments, a communication interface 1470 is a cable modem that converts signals on bus 1410 into signals for a communication connection over a coaxial cable or into optical signals for a communication connection over a fiber optic cable. As another example, communications interface 1470 may be a local area network (LAN) card to provide a data communication connection to a compatible LAN, such as Ethernet. Wireless links may also be implemented. For wireless links, the communications interface 1470 sends and receives electrical, acoustic or electromagnetic signals, including infrared and optical signals, that carry information streams, such as digital data. Such signals are examples of carrier waves.

The term computer-readable medium is used herein to refer to any medium that participates in providing information to processor 1402, including instructions for execution. Such a medium may take many forms, including, but not limited to, non-volatile media, volatile media and transmission media. Non-volatile media include, for example, optical or magnetic disks, such as storage device 1408. Volatile media include, for example, dynamic memory 1404. Transmission media include, for example, coaxial cables, copper wire, fiber optic cables, and waves that travel through space without wires or cables, such as acoustic waves and electromagnetic waves, including radio, optical and infrared waves. Signals that are transmitted over transmission media are herein called carrier waves.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read.

Network link 1478 typically provides information communication through one or more networks to other devices that use or process the information. For example, network link 1478 may provide a connection through local network 1480 to a host computer 1482 or to equipment 1484 operated by an Internet Service Provider (ISP). ISP equipment 1484 in turn provides data communication services through the public, world-wide packet-switching communication network of networks now commonly referred to as the Internet 1490. A computer called a server 1492 connected to the Internet provides a service in response to information received over the Internet. For example, server 1492 provides information representing video data for presentation at display 1414.

The invention is related to the use of computer system 1400 for implementing the techniques described herein. According to one embodiment of the invention, those techniques are performed by computer system 1400 in response to processor 1402 executing one or more sequences of one or more instructions contained in memory 1404. Such instructions, also called software and program code, may be read into memory 1404 from another computer-readable medium such as storage device 1408. Execution of the sequences of instructions contained in memory 1404 causes processor 1402 to perform the method steps described herein. In alternative embodiments, hardware, such as application specific integrated circuit 1420, may be used in place of or in combination with software to implement the invention. Thus, embodiments of the invention are not limited to any specific combination of hardware and software.

The signals transmitted over network link 1478 and other networks through communications interface 1470, which carry information to and from computer system 1400, are exemplary forms of carrier waves. Computer system 1400 can send and receive information, including program code, through the networks 1480, 1490 among others, through network link 1478 and communications interface 1470. In an example using the Internet 1490, a server 1492 transmits program code for a particular application, requested by a message sent from computer 1400, through Internet 1490, ISP equipment 1484, local network 1480 and communications interface 1470. The received code may be executed by processor 1402 as it is received, or may be stored in storage device 1408 or other non-volatile storage for later execution, or both. In this manner, computer system 1400 may obtain application program code in the form of a carrier wave.

Various forms of computer readable media may be involved in carrying one or more sequence of instructions or data or both to processor 1402 for execution. For example, instructions and data may initially be carried on a magnetic disk of a remote computer such as host 1482. The remote computer loads the instructions and data into its dynamic memory and sends the instructions and data over a telephone line using a modem. A modem local to the computer system 1400 receives the instructions and data on a telephone line and uses an infra-red transmitter to convert the instructions and data to an infra-red signal, a carrier wave serving as the network link 1478. An infrared detector serving as communications interface 1470 receives the instructions and data carried in the infrared signal and places information representing the instructions and data onto bus 1410. Bus 1410 carries the information to memory 1404 from which processor 1402 retrieves and executes the instructions using some of the data sent with the instructions. The instructions and data received in memory 1404 may optionally be stored on storage device 1408, either before or after execution by the processor 1402.

11. EXTENSIONS AND MODIFICATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for erasing spectral features stored in a medium based on a two-state atomic system having a transition dipole moment of µ, in which an atom transitions between a first state and a second state, comprising the step of causing a chirped electromagnetic field to pass into the medium:

varying a monochromatic frequency of the chirped electromagnetic field in time by a chirp rate κ over an erasure frequency band of bandwidth $B_E$ during an erasure time interval $T_E$; wherein an amplitude $A_E$ of the electromagnetic field oscillations in the chirped electromagnetic field over the erasure frequency band is substantively constant and substantively specified by an equation of form $$A_E = (\hbar/\mu\pi)\sqrt{(\kappa \ln 2)},$$

in which hbar is Plank's constant, ln is a natural logarithm function, and π is a ratio of a circumference of a circle to a diameter of the circle, whereby substantively fifty percent of the two-state atomic system responsive in the erasure frequency band exposed to the chirped electromagnetic field is in the first state after erasure regardless of a percentage in the first state before erasure.

2. A method as recited in claim 1, wherein:

the chirped electromagnetic field further includes a start edge in a start time interval $T_S$ adjacent before the erasure time interval $T_E$; and an amplitude $A_S$ of the electromagnetic field oscillations during the start time interval $T_S$ increases with a substantively continuous first derivative from substantively zero at a start of the start time interval $T_S$ to $A_E$ and a substantively zero rate of change at an end of the start time interval $T_S$.

3. A method as recited in claim 2, wherein a frequency ω(t) of the electromagnetic field oscillations at a time t during the start time interval $T_S$ changes with a substantively continuous first derivative to match a start frequency $ω_0$ and start frequency rate of change $κ_S$ at a start of the erasure time interval $T_E$.

4. A method as recited in claim 2, wherein a phase of the electromagnetic field oscillations during the start time interval $T_S$ changes with a substantively continuous first derivative to match a start phase and start phase rate of change at a start of the erasure time interval $T_E$.

5. A method as recited in claim 2, wherein $A_S$ is substantively specified by an equation of form $$A_S(t) = \{\cosine\ [\pi(t-t_0)/T_S]+1\}A_E/2,$$

in which t is time and $t_0$ is time at a start of the erasure time interval $T_E$.

6. A method as recited in claim 3, wherein ω(t) during the start time interval $T_S$ is substantively specified by an equation of form $$d\omega(t)/dt = \{\cosine\ [\pi(t-t_0)/T_S]+1\}\kappa s/2,$$

in which t is time, $t_0$ is time at a start of the erasure time interval $T_E$, dω(t)/dt is time rate of change of frequency at a time t, and κs is the start frequency rate of change at time $t_0$.

7. A method as recited in claim 1, wherein:

the chirped electromagnetic field further includes a finish edge in a finish time interval $T_F$ adjacent after the erasure time interval $T_E$; and an amplitude $A_F$ of the electromagnetic field oscillations during the finish time interval $T_F$ decreases with a substantively continuous first derivative from a value substantively equal to $A_E$ with a substantively zero rate of change at a start of the finish time interval $T_F$ to zero at an end of the finish time interval $T_F$.

8. A method as recited in claim 7, wherein a frequency ω(t) of the electromagnetic field oscillations at a time t during the finish time interval $T_F$ changes with a substantively continuous first derivative to match an end-erase frequency ωe and an end-erase frequency rate of change κe at an end of the erasure time interval $T_E$.

9. A method as recited in claim 7, wherein a phase of the electromagnetic field oscillations during the finish time interval $T_F$ changes with a substantively continuous first derivative to match an end-erase phase and an end-erase phase rate of change at an end of the erasure time interval $T_E$.

10. A method as recited in claim 7, wherein $A_F$ is substantively specified by an equation of form $$A_F(t) = \{\cosine\ [\pi(t-t_0-T_E)/T_F]+1\}A_E/2,$$

in which t is time and to is time at a start of the erasure time interval $T_E$.

11. A method as recited in claim 8, wherein ω(t) during the finish time interval $T_F$ is substantively specified by an equation of form $$d\omega(t)/dt = \{\cosine\ [\pi(t-t_0-T_E)/T_F]+1\}\kappa e/2,$$

in which t is time, $t_0$ is time at a start of the erasure time interval $T_E$, dω(t)/dt is time rate of change of frequency at a time t, and κe is the end-erase frequency rate of change at the end of the erasure time interval $T_E$.

12. A method as recited in claim 1, wherein the chirp rate κ is substantively constant over the erasure frequency band and substantively equal to $B_E/T_E$.

13. A method as recited in claim 2, wherein:

the chirped electromagnetic field further includes a finish edge in a finish time interval $T_F$ adjacent after the erasure time interval $T_E$; and an amplitude $A_F$ of the electromagnetic field oscillations during the finish time interval $T_F$ decreases with a substantively continuous first derivative from a value substantively equal to $A_E$ with a substantively zero rate of change at a start of the finish time interval $T_F$ to zero at an end of the finish time interval $T_F$.

14. A method as recited in claim 13, wherein a duration of the start time interval $T_S$ is substantively equal to a duration of the finish time interval $T_F$.

15. A method as recited in claim 1, wherein the amplitude $A_E$ of the electromagnetic field oscillations over the bandwidth $B_E$ is substantively constant and substantively specified by the equation for a particular portion less than all of the medium, in which portion spectral features are to be erased.

16. A method as recited in claim 1, wherein the medium is an inhomogeneously broadened transition (IBT) material and the amplitude $A_E$ and dipole moment µ are for an electric field.

17. A method as recited in claim 1, wherein the medium is a material subjected to a magnetic field for nuclear magnetic resonance (NMR) measurements and the amplitude $A_E$ and dipole moment µ are for a magnetic field.

18. A method as recited in claim 1, further comprising the step of causing a different chirped electromagnetic field to pass into the medium, wherein:

the different chirped electromagnetic field has a monochromatic frequency that varies in time by a chirp rate κ2 over a different erasure frequency band of bandwidth $B_{E2}$ during the same erasure time interval $T_E$; and an amplitude $A_{E2}$ of the electromagnetic field oscillations in the different chirped electromagnetic field over the bandwidth $B_{E2}$ is substantively constant and substantively specified by an equation of form $$A_{E2} = (\hbar/\mu\pi)\sqrt{(\kappa 2 \ln 2)}$$

whereby substantively fifty percent of the two-state atomic system responsive in the different erasure frequency band exposed to the different chirped electromagnetic field is in the first state after erasure regardless of a percentage in the first state before erasure.

19. A method as recited in claim 1, further comprising:

in response to causing the chirped electromagnetic field to pass into the medium, receiving a readout electromagnetic field from the medium; and determining the spectral features stored in the medium within the erasure frequency band before erasure based on the readout electromagnetic field.

20. A method as recited in claim 1, wherein:

interactions of the chirped electromagnetic field and the medium are coherent over a time scale up to time $T_2$; and the chirp rate κ within the erasure frequency band satisfies an inequality given by $$\kappa \gg \ln 2/(\pi T_2)^2,$$

whereby erasure is effective even at small values for $T_2$.

21. A method as recited in claim 1, wherein:

the medium is an optical absorption medium with frequency-dependent absorption based on the two state atomic system;

the two-state atomic system has a population decay time that describes a rate of return of a population of atoms in the two-state atomic system to a ground state of the two state atomic system; and the method further comprises waiting a particular time based on a target absorption value and the population decay time, whereby absorption over the erasure frequency band attains the target absorption value.

22. A method as recited in claim 3, wherein ω(t) during the start time interval $T_S$ is substantively specified by an equation of form $$d\omega(t)/dt = \kappa s$$

in which t is time, dω(t)/dt is time rate of change of frequency at a time t, and κs is the start frequency rate of change at a start of the erasure time interval $T_E$.

23. A method as recited in claim 22, wherein: κ is a constant substantively equal to $B_E/T_E$; and κs is substantively equal to κ.

24. A method as recited in claim 8, wherein ω(t) during the finish time interval $T_F$ is substantively specified by an equation of form $$d\omega(t)/dt = \kappa e$$

in which t is time, dω(t)/dt is time rate of change of frequency at a time t, and κe is the end-erase frequency rate of change at the end of the erasure time interval $T_E$.

25. A method as recited in claim 24, wherein: κ is a constant substantively equal to $B_E/T_E$; and κe is substantively equal to κ.

26. A method for inverting non-uniform spectral features stored in a medium based on a two-state atomic system having a transition dipole moment of μ, in which an atom transitions between a first state and a second state, comprising the step of causing a chirped electromagnetic field to pass into the medium:

varying a monochromatic frequency of the chirped electromagnetic field, wherein: in time by a chirp rate κ over an inversion frequency band of bandwidth $B_I$ during an inversion time interval $T_I$; wherein an amplitude $A_I$ of the electromagnetic field oscillations in the chirped electromagnetic field over the inversion frequency band is substantively constant and substantively specified by an equation of form $$A_I = (\hbar/\mu\pi)\sqrt{(\kappa \ln[2/\epsilon])},$$

in which hbar is Plank's constant, ln is a natural logarithm function, π is a ratio of a circumference of a circle to a diameter of the circle, and ε is a non-zero fractional difference from complete inversion, whereby a particular relative population (r) of the excited state of the two-state atomic system, responsive at a particular frequency in the inversion frequency band exposed to the chirped electromagnetic field, is substantively equal to $X*(1-\epsilon)$ after inversion when the relative population of the excited state is $-X$ before inversion, wherein r is +1 to indicate all atoms are in the excited state and r is −1 to indicate all atoms are in the ground state.

27. A method as recited in claim 26, wherein:

the chirped electromagnetic field further includes a start edge in a start time interval $T_S$ adjacent before the inversion time interval $T_I$; and an amplitude $A_S$ of the electromagnetic field oscillations during the start time interval $T_S$ increases with a substantively continuous first derivative from substantively zero at a start of the start time interval $T_S$ to $A_I$ and a substantively zero rate of change at an end of the start time interval $T_S$.

28. A method as recited in claim 27, wherein a frequency ω(t) of the electric field oscillations at a time t during the start time interval $T_S$ changes with a substantively continuous first derivative to match a start frequency ωs and start frequency rate of change κs at a start of the inversion time interval $T_I$.

29. A method as recited in claim 27, wherein a phase of the electromagnetic field oscillations during the start time interval $T_S$ changes with a substantively continuous first derivative to match a start phase and start phase rate of change at a start of the inversion time interval $T_I$.

30. A method as recited in claim 27, wherein $A_S$ is substantively specified by an equation of form $$A_S(t) = \{\sec h[(t-t_0)/(T_S/2)]\} A_I,$$

in which t is time and $t_0$ is time at a start of the erasure time interval $T_I$ and sech is the hyperbolic secant function.

31. A method as recited in claim 28, wherein ω(t) during the start time interval $T_S$ is substantively specified by an equation of form $$\omega(t) = \omega_0 + \{T_S \tan h[(t-t_0)/(T_S/2)] - T_I\}\kappa s/2,$$

in which t is time, to is time at a start of the inversion time interval $T_I$, $\omega_0$ is frequency at time $t_0$, κs is the start frequency rate of change at time $t_0$, and tanh is the hyperbolic tangent function.

32. A method as recited in claim 26, wherein:

the chirped electromagnetic field further includes a finish edge in a finish time interval $T_F$ adjacent after the inversion time interval $T_I$; and an amplitude $A_F$ of the electromagnetic field oscillations during the finish time interval $T_F$ decreases with a substantively continuous first derivative from a value substantively equal to $A_I$ with a substantively zero rate of change at a start of the finish time interval $T_F$ to zero at an end of the finish time interval $T_F$.

33. A method as recited in claim 32, wherein a frequency $\omega(t)$ of the electromagnetic field oscillations at a time t during the finish time interval $T_F$ changes with a substantively continuous first derivative to match an end-invert frequency $\omega_0+B_I$ and an end-invert frequency rate of change $\kappa e$ at an end of the inversion time interval $T_I$.

34. A method as recited in claim 32, wherein a phase of the electromagnetic oscillations during the finish time interval $T_F$ changes with a substantively continuous first derivative to match an end-invert phase and an end-invert phase rate of change at an end of the inversion time interval $T_I$.

35. A method as recited in claim 32, wherein $A_F$ is substantively specified by an equation of form $$A_F(t)=\{\sec h[(t-t_0-T_I)/(T_F/2)]\}A_I,$$

in which t is time and to is time at a start of the inversion time interval $T_I$.

36. A method as recited in claim 33, wherein $\omega(t)$ during the finish time interval $T_F$ is substantively specified by an equation of form $$\omega(t)=\omega_0+\{T_S \tan h[(t-t_0-T_I)/(T_S/2)]+T_I\}\kappa e/2,$$

in which t is time, $t_0$ is time at a start of the inversion time interval $T_I$, $\omega_0$ is frequency at time $t_0$, and $\kappa e$ is the end-invert frequency rate of change at the end of the inversion time interval $T_I$.

37. A method as recited in claim 26, wherein the chirp rate $\kappa$ is substantively constant over the inversion frequency band and substantively equal to $B_I/T_I$.

38. A method as recited in claim 27, wherein:
the chirped electromagnetic field further includes a finish edge in a finish time interval $T_F$ adjacent after the inversion time interval $T_I$; and
an amplitude $A_F$ of the electromagnetic field oscillations during the finish time interval $T_F$ decreases with a substantively continuous first derivative from a value substantively equal to $A_I$ with a substantively zero rate of change at a start of the finish time interval $T_F$ to zero at an end of the finish time interval $T_F$.

39. A method as recited in claim 38, wherein the start time interval $T_S$ is substantively equal to the finish time interval $T_F$.

40. A method as recited in claim 26, wherein the amplitude $A_I$ of the electromagnetic field oscillations over the inversion frequency band is substantively constant and substantively specified by the equation for a particular portion less than all of the medium in which portion spectral features are to be inverted.

41. A method as recited in claim 26, wherein the medium is an inhomogeneously broadened transition (IBT) material and the amplitude $A_I$ and dipole moment μ are for an electric field.

42. A method as recited in claim 26, wherein the medium is a material subjected to a magnetic field for nuclear magnetic resonance (NMR) measurements and the amplitude $A_I$ and dipole moment μ are for a magnetic field.

43. A method as recited in claim 26, further comprising the step of causing a different chirped electromagnetic field to pass into the medium, wherein:
the different chirped electromagnetic field has a monochromatic frequency that varies in time by a chirp rate κ2 over a different inversion frequency band of bandwidth $B_{I2}$ during the same inversion time interval $T_I$; and
an amplitude $A_{I2}$ of the electromagnetic field oscillations in the different chirped electromagnetic field over the bandwidth $B_{I2}$ is substantively constant and substantively specified by an equation of form $$A_{I2}=(\hbar\mathrm{bar}/\mu\pi)\sqrt{(\kappa 2\ln[2/\epsilon 2])}$$

in which $\epsilon 2$ is a non-zero fractional difference from complete inversion
whereby a particular relative population (r) of the excited state of the two-state atomic system, responsive at a particular frequency in the inversion frequency band exposed to the chirped electromagnetic field, is substantively equal to $X*(1-\epsilon)$ after inversion when the relative population of the excited state is $-X$ before inversion, wherein r is +1 to indicate all atoms are in the excited state and r is −1 to indicate all atoms are in the ground state.

44. A method as recited in claim 26, wherein:
interactions of the chirped electromagnetic field and the medium are coherent over a time scale up to time $T_2$; and
the chirp rate κ within the inversion frequency band satisfies an inequality given by $$\kappa \gg \ln [2/\epsilon]/(\pi T_2)^2,$$

whereby inversion is effective even at small values for $T_2$.

45. A method as recited in claim 26, wherein:
the medium is an optical absorption medium with frequency-dependent absorption based on the two state atomic system;
the two-state atomic system has a population decay time that describes a rate of return of a population of atoms in the two-state atomic system to a ground state of the two state atomic system; and
the method further comprises waiting a particular time based on a target absorption value and the population decay time,
whereby absorption over the inversion frequency band attains the target absorption value.

46. A method as recited in claim 28, wherein $\omega(t)$ during the start time interval $T_S$ is substantively specified by an equation of form $$d\omega(t)/dt=\kappa s$$

in which t is time, $d\omega(t)/dt$ is time rate of change of frequency at a time t, and κs is the start frequency rate of change at a start of the inversion time interval $T_I$.

47. A method as recited in claim 46, wherein: κ is a constant substantively equal to $B_I/T_I$; and κs is substantively equal to κ.

48. A method as recited in claim 33, wherein $\omega(t)$ during the finish time interval $T_F$ is substantively specified by an equation of form $$d\omega(t)/dt=\kappa e$$

in which t is time, $d\omega(t)/dt$ is time rate of change of frequency at a time t, and κe is the end-erase frequency rate of change at the end of the inversion time interval $T_I$.

49. A method as recited in claim 48, wherein: κ is a constant substantively equal to $B_I/T_I$; and κe is substantively equal to κ.

50. An apparatus for reconfiguring spectral features stored in a medium based on a two-state atomic system having a transition dipole moment of μ, in which an atom transitions between a first state and a second state, comprising:
  means to form a chirped electromagnetic field wherein
    the chirped electromagnetic field includes a monochromatic frequency that varies in time by a chirp rate κ over a reconfiguration frequency band of bandwidth $B_R$ during a reconfiguration time interval $T_R$, and
    an amplitude $A_R$ of the electromagnetic field oscillations in the chirped electromagnetic field over the reconfiguration frequency band is substantively constant and substantively specified by an equation of form $A_R = (h\text{bar}/\mu\pi)\sqrt{(\kappa \ln[2/\epsilon])}$, in which hbar is Plank's constant, ln is a natural logarithm function, π is a ratio of a circumference of a circle to a diameter of the circle; and
  means for passing the chirped electromagnetic field into the medium,
  whereby
    for ε<<1, a particular relative population (r) of the excited state of the two-state atomic system, responsive at a particular frequency in the inversion frequency band exposed to the chirped electromagnetic field, is substantively equal to X*(1−ε) after inversion when the relative population of the excited state is −X before inversion, wherein r is +1 to indicate all atoms are in the excited state and r is −1 to indicate all atoms are in the ground state, and
    for ε=1, substantively fifty percent of the two-state atomic system responsive in the erasure frequency band exposed to the chirped electromagnetic field is in the first state after erasure regardless of a percentage in the first state before erasure.

51. An apparatus for reconfiguring spectral features stored in a medium based on a two-state atomic system having a transition dipole moment of μ, in which an atom transitions between a first state and a second state, comprising:
  a controller to form a chirped electromagnetic field wherein
    the chirped electromagnetic field includes a monochromatic frequency that varies in time by a chirp rate κ over a reconfiguration frequency band of bandwidth $B_R$ during a reconfiguration time interval $T_R$, and
    an amplitude $A_R$ of electromagnetic field oscillations in the chirped electromagnetic field over the reconfiguration frequency band is substantively constant and substantively specified by an equation of form $A_R = (h\text{bar}/\mu\pi)\sqrt{(\kappa \ln[2/\epsilon])}$, in which hbar is Plank's constant, ln is a natural logarithm function, π is a ratio of a circumference of a circle to a diameter of the circle;
  an electromagnetic modulator for modulating an electromagnetic carrier frequency with the chirped electromagnetic field to form a reconfiguration beam; and
  an electromagnetic coupler for passing the reconfiguration beam into the medium,
  whereby
    for ε<<1, a particular relative population (r) of the excited state of the two-state atomic system, responsive at a particular frequency in the inversion frequency band exposed to the chirped electromagnetic field, is substantively equal to X*(1−ε) after inversion when the relative population of the excited state is −X before inversion, wherein r is +1 to indicate all atoms are in the excited state and r is −1 to indicate all atoms are in the ground state, and
    for ε=1, substantively fifty percent of the two-state atomic system responsive in the erasure frequency band exposed to the chirped electromagnetic field is in the first state after erasure regardless of a percentage in the first state before erasure.

52. A computer-readable medium carrying one or more sequences of instructions for forming chirped electromagnetic field to reconfigure spectral features stored in a medium based on a two-state atomic system having a transition dipole moment of μ, in which an atom transitions between a first state and a second state, wherein execution of the one or more sequences of instructions by one or more processors causes the one or more processors to perform the steps of:
  determining a temporal frequency form for a chirped electromagnetic field that includes a monochromatic frequency that varies in time by a chirp rate κ over a reconfiguration frequency band of bandwidth $B_R$ during a reconfiguration time interval $T_R$; and
  determining an amplitude $A_R$ of electromagnetic field oscillations in the chirped electromagnetic field over the reconfiguration frequency band that is substantively constant and substantively specified by an equation of form $A_R = (h\text{bar}/\mu\pi)\sqrt{(\kappa \ln[2/\epsilon])}$, in which hbar is reduced Plank's constant, ln is a natural logarithm function, π is a ratio of a circumference of a circle to a diameter of the circle; and
  driving an electromagnetic modulator to impose the chirped electromagnetic field onto an electromagnetic carrier frequency,
  whereby
    for ε<<1, a particular relative population (r) of the excited state of the two-state atomic system, responsive at a particular frequency in the inversion frequency band exposed to the chirped electromagnetic field, is substantively equal to X*(1−ε) after inversion when the relative population of the excited state is −X before inversion, wherein r is +1 to indicate all atoms are in the excited state and r is −1 to indicate all atoms are in the ground state, and
    for ε=1, substantively fifty percent of the two-state atomic system responsive in the erasure frequency band exposed to the chirped electromagnetic field is in the first state after erasure regardless of a percentage in the first state before erasure.

* * * * *

UNITED STATES PATENT AND TRADEMARK OFFICE
CERTIFICATE OF CORRECTION

PATENT NO. : 7,307,781 B1
APPLICATION NO. : 11/487571
DATED : December 11, 2007
INVENTOR(S) : Chang et al.

Page 1 of 1

It is certified that error appears in the above-identified patent and that said Letters Patent is hereby corrected as shown below:

col. 28, line 21: replace "to" with --$t_0$-- col. 30, line 51: replace "sec h" with --sech-- col. 30, line 58: replace "tan h" with --tanh-- col. 30, line 60: replace "to" with --$t_0$-- col. 31, line 20: replace "sec h" with --sech-- col. 31, line 22: replace "to" with --$t_0$-- col. 31, line 27: replace "tan h" with --tanh--

Signed and Sealed this

Thirteenth Day of May, 2008

JON W. DUDAS
*Director of the United States Patent and Trademark Office*